US012482634B2

(12) United States Patent
Drewery et al.

(10) Patent No.: US 12,482,634 B2
(45) Date of Patent: Nov. 25, 2025

(54) SYMMETRIC COUPLING OF COIL TO DIRECT-DRIVE RADIOFREQUENCY POWER SUPPLIES

(71) Applicant: Lam Research Corporation, Fremont, CA (US)

(72) Inventors: John Drewery, San Jose, CA (US); Alexander Miller Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/689,030

(22) PCT Filed: Sep. 14, 2022

(86) PCT No.: PCT/US2022/043464
§ 371 (c)(1),
(2) Date: Mar. 4, 2024

(87) PCT Pub. No.: WO2023/043795
PCT Pub. Date: Mar. 23, 2023

(65) Prior Publication Data
US 2024/0395503 A1    Nov. 28, 2024

Related U.S. Application Data

(60) Provisional application No. 63/245,773, filed on Sep. 17, 2021.

(51) Int. Cl.
*H01J 37/32* (2006.01)
(52) U.S. Cl.
CPC .. *H01J 37/32165* (2013.01); *H01J 37/32128* (2013.01); *H01J 37/32146* (2013.01); *H01J 37/32183* (2013.01)

(58) Field of Classification Search
CPC ........... H01J 37/32165; H01J 37/32128; H01J 37/32146; H01J 37/32183
See application file for complete search history.

(56) References Cited

U.S. PATENT DOCUMENTS 10,264,663 B1 *   4/2019   Long ..................... H03F 3/2173
2002/0140359 A1   10/2002  Chen et al.
(Continued)

FOREIGN PATENT DOCUMENTS

KR    20240115350 A  *  7/2024  ........... H03H 7/0115
WO       2019217180 A1     11/2019
(Continued)

OTHER PUBLICATIONS

PCT Application No. PCT/US2022/043464, International Search Report and Written Opinion, Mailed Jan. 10, 2023, 11 pages.

*Primary Examiner* — Adam D Houston
(74) *Attorney, Agent, or Firm* — Penilla IP, APC

(57) ABSTRACT

A coil is disposed next to a plasma processing chamber. A first direct-drive radiofrequency (RF) power supply has an output through which a first shaped-amplified square waveform signal is transmitted. A first reactive circuit is connected between the output of the first direct-drive RF power supply and a first end of the coil. The first reactive circuit transforms the first shaped-amplified square waveform signal into a first shaped-sinusoidal signal in route to the first end of the coil. A second direct-drive RF power supply has an output through which a second shaped-amplified square waveform signal is transmitted. A second reactive circuit is connected between the output of the second direct-drive RF power supply and a second end of the coil. The second reactive circuit transforms the second shaped-amplified square waveform signal into a second shaped-sinusoidal signal in route to the second end of the coil.

20 Claims, 9 Drawing Sheets

(56) References Cited

U.S. PATENT DOCUMENTS

| | | |
|---|---|---|
| 2008/0138993 A1 | 6/2008 | Hiroshima et al. |
| 2008/0272089 A1 | 11/2008 | Grimbergen et al. |
| 2009/0278598 A1 | 11/2009 | van Zyl et al. |
| 2012/0262064 A1 | 10/2012 | Nagarkatti et al. |
| 2016/0236279 A1 | 8/2016 | Ashton et al. |
| 2016/0282440 A1 | 9/2016 | Tanaka |
| 2018/0092196 A1 | 3/2018 | Notomi et al. |
| 2019/0116656 A1 | 4/2019 | Long et al. |
| 2019/0177848 A1 | 6/2019 | Chen et al. |
| 2019/0385821 A1 | 12/2019 | Long et al. |
| 2020/0357616 A1 | 11/2020 | Allen et al. |
| 2022/0117074 A1* | 4/2022 | Long ................. H05H 1/46 |
| 2025/0149296 A1* | 5/2025 | Koshimizu ....... H01J 37/32449 |

FOREIGN PATENT DOCUMENTS

| | | | |
|---|---|---|---|
| WO | 2020055813 A1 | 3/2020 | |
| WO | 2020223127 A1 | 11/2020 | |
| WO | WO-2023043795 A1 * | 3/2023 | ........ H01J 37/32183 |

* cited by examiner

SYMMETRIC COUPLING OF COIL TO DIRECT-DRIVE RADIOFREQUENCY POWER SUPPLIES

This application is a national stage filing of and claims priority, under 35 U.S.C. § 371, to PCT/US2022/043464, filed on Sep. 14, 2022, which claims the benefit of U.S. Provisional Application No. 63/245,773, filed on Sep. 17, 2021. The entire disclosure of each application referenced above is incorporated herein by reference.

BACKGROUND

Plasma processing systems are used to manufacture semiconductor devices, e.g., chips/die, on semiconductor wafers. In the plasma processing system, the semiconductor wafer is exposed to various types of plasma to cause prescribed changes to a condition of the semiconductor wafer, such as through material deposition and/or material removal and/or material implantation and/or material modification, etc. The plasma processing system conventionally includes a radiofrequency (RF) source, an RF transmission cable, an RF impedance matching network, an electrode, and a plasma generation chamber. The RF source is connected to the RF impedance matching network through the RF transmission cable. The RF impedance matching network is connected to the electrode through an electrical conductor. RF power generated by the RF source is transmitted through the RF transmission cable and through the RF impedance matching network to the electrode. RF power transmitted from the electrode causes a process gas to be transformed into a plasma within the plasma generation chamber. It is within this context that embodiments described in the present disclosure arise.

SUMMARY

In an example embodiment, a plasma processing system is disclosed. The plasma processing system includes a plasma processing chamber and a coil disposed next to the plasma processing chamber. The coil has a first end and a second end. The plasma processing system also includes a first direct-drive RF power supply that has an output through which a first shaped-amplified square waveform signal is transmitted. The plasma processing system also includes a first reactive circuit connected between the output of the first direct-drive RF power supply and the first end of the coil. The first reactive circuit is configured to transform the first shaped-amplified square waveform signal into a first shaped-sinusoidal signal in route to the first end of the coil. The plasma processing system also includes a second direct-drive RF power supply that has an output through which a second shaped-amplified square waveform signal is transmitted. The plasma processing system also includes a second reactive circuit connected between the output of the second direct-drive RF power supply and the second end of the coil. The second reactive circuit is configured to transform the second shaped-amplified square waveform signal into a second shaped-sinusoidal signal in route to the second end of the coil.

In an example embodiment, a method is disclosed for operating a plasma processing system. The method includes operating a first direct-drive RF signal generator to generate a first shaped-amplified square waveform signal. The method also includes transmitting the first shaped-amplified square waveform signal to a first reactive circuit. The method also includes operating the first reactive circuit to transform the first shaped-amplified square waveform signal into a first shaped-sinusoidal signal. The method also includes transmitting the first shaped-sinusoidal signal to a first end of a coil of a plasma processing chamber. The first shaped-sinusoidal signal conveys RF power to the coil. The method also includes operating a second direct-drive RF signal generator to generate a second shaped-amplified square waveform signal. The method also includes transmitting the second shaped-amplified square waveform signal to a second reactive circuit. The method also includes operating the second reactive circuit to transform the second shaped-amplified square waveform signal into a second shaped-sinusoidal signal. The method also includes transmitting the second shaped-sinusoidal signal to a second end of the coil of the plasma processing chamber. The second shaped-sinusoidal signal conveys RF power to the coil.

In an example embodiment, a plasma processing system is disclosed. The plasma processing system includes a plasma processing chamber and a coil disposed next to the plasma processing chamber. The coil has a first end and a second end. The plasma processing system also includes a direct-drive RF power supply that has an output through which a shaped-amplified square waveform signal is transmitted. The plasma processing system also includes a reactive circuit connected between the output of the direct-drive RF power supply and the first end of the coil. The reactive circuit is configured to transform the shaped-amplified square waveform signal into a shaped-sinusoidal signal in route to the first end of the coil. The plasma processing system also includes a variable capacitor that has an input terminal connected to the second end of the coil. The variable capacitor has an output terminal connected to a reference ground potential.

In an example embodiment, a method is disclosed for operating a plasma processing system. The method includes operating a direct-drive RF signal generator to generate a shaped-amplified square waveform signal. The method also includes transmitting the shaped-amplified square waveform signal to a reactive circuit. The method also includes operating the reactive circuit to transform the shaped-amplified square waveform signal into a shaped-sinusoidal signal. The method also includes transmitting the shaped-sinusoidal signal to a first end of a coil of a plasma processing chamber. The shaped-sinusoidal signal conveys RF power to the coil. The method also includes adjusting a capacitance setting of a variable capacitor connected between a second end of the coil and a reference ground potential to achieve a prescribed condition associated with conveyance of RF power from the coil to a plasma within the plasma processing chamber.

Other aspects and advantages of the embodiments will become more apparent from the following detailed description and the accompanying drawings.

DETAILED DESCRIPTION

In the following description, numerous specific details are set forth in order to provide a thorough understanding of the present disclosure. It will be apparent, however, to one skilled in the art that embodiments of the present disclosure may be practiced without some or all of these specific details. In other instances, well known process operations have not been described in detail in order not to unnecessarily obscure the present disclosure.

Figure 1:
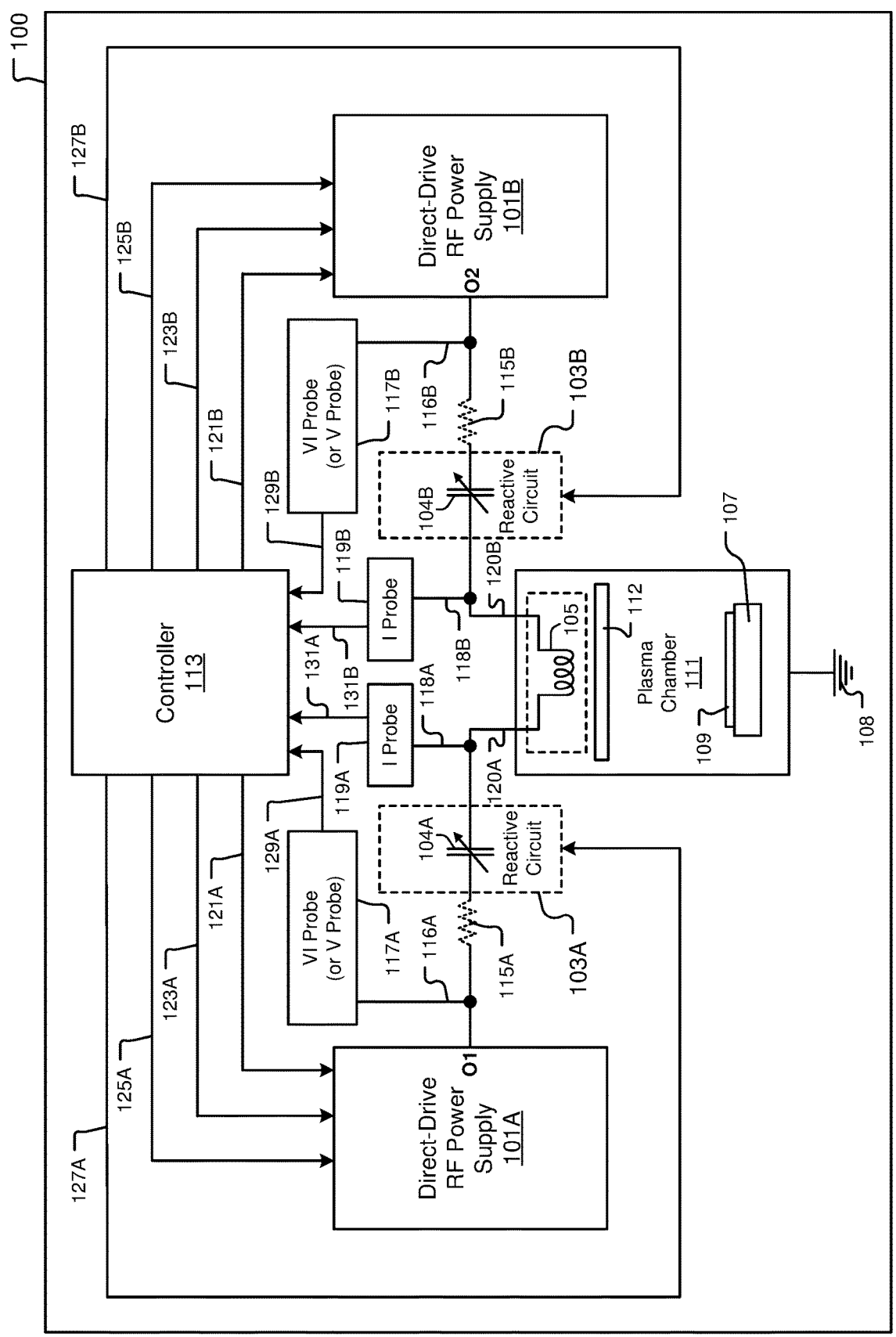
FIG. 1 shows a diagram of a plasma processing system that implements symmetrically coupled direct-drive RF power supplies, in accordance with some embodiments.

FIG. 1 shows a diagram of a plasma processing system 100 that implements symmetrically coupled direct-drive radiofrequency (RF) power supplies 101A and 101B, in accordance with some embodiments. The plasma processing system 100 includes a first direct-drive RF power supply 101A connected through a first reactive circuit 103A to a first end of a coil 105, as indicated by a connection 120A. The plasma processing system 100 also includes a second direct-drive RF power supply 101B connected through a second reactive circuit 103B to a second end of the coil 105, as indicated by a connection 120B. In this manner, the coil 105 is connected to the first and second direct-drive RF power supplies 101A and 101B in a symmetric manner. Each of the first and second direct-drive RF power supplies 101A and 101B is configured to generate and deliver RF power to a plasma processing chamber 111, by way of the coil 105, without having to transmit RF signals through an RF cable and an impedance matching network in route to the plasma processing chamber 111. Each of the direct-drive RF power supplies 101A and 101B is also referred to as a matchless plasma source (MPS).

In some embodiments, the coil is 105 disposed above a window 112 of the plasma processing chamber 111. In various embodiments, the window 112 is formed of a dielectric material, such as quartz or other similar material, that allows RF power to be transmitted from the coil 105 through the window 112 and into the plasma processing chamber 111. The plasma processing chamber 111 is electrically connected to a reference ground potential 108. As the RF power is transmitted into and through the plasma processing chamber 111, the RF power transforms a process gas into a plasma within the plasma processing chamber 111 in exposure to a semiconductor wafer 109 that is supported on a substrate holder 107, such as electrostatic chuck, within the plasma processing chamber 111. In various embodiments, the plasma is used to provide controlled modification of a condition of the semiconductor wafer 109, such as through material deposition and/or material removal and/or material implantation and/or material modification, etc. Also, in some embodiments, a plasma is generated in the plasma processing chamber 111 to provide for cleaning of the plasma processing chamber 111. The direct-drive RF power supplies 101A and 101B are described in detail below with regard to FIG. 2. For the present discussion, it should be understood that each of the direct-drive RF power supplies 101A and 101B is configured to generate RF signals having a prescribed waveform as a function of time, and deliver the generated RF signals to the coil 105.

Within the plasma processing chamber 111, the RF power causes the process gas to transform into a plasma in exposure to the wafer 109 supported on the substrate holder 107. Also, during operation of the plasma processing chamber 111, exhaust gases and by-product materials from processing of the wafer 109 are exhausted from the plasma processing chamber 111. It should be understood that in various embodiments operation of the plasma processing chamber 111 can include many other additional operations, such as generating a bias voltage at the wafer 109 level to attract or repel electrically charged constituents of the plasma toward or away from the wafer 109, and/or controlling a temperature of the wafer 109, and/or applying additional RF power to one or more electrode(s) disposed within the substrate holder 107 to generate additional plasma, among other additional operations. Also, in various embodiments, the plasma processing chamber 111 is operated in accordance with a prescribed recipe that specifies a temporal schedule for controlling one or more of: supply of process gas(es) to the plasma processing chamber 111, pressure and temperature within the plasma processing chamber 111, supply of RF power to the coil 105, supply of bias voltage at the wafer 109 level, supply of RF power to electrode(s) within the substrate holder 107, among essentially any other process parameter associated with operation of the plasma processing chamber 111.

The plasma processing system 100 includes a controller 113 for controlling operation of the first direct-drive RF power supply 101A and the second direct-drive RF power supply 101B. In some embodiments, the controller 113 includes a processor and a memory device. In some embodiments, the controller 113 includes one or more of a microprocessor, an application specific integrated circuit (ASIC), a central processing unit, a processor, a programmable logic device (PLD), and a Field Programmable Gate Array (FPGA). The controller 113 is connected to transmit waveform generator control signals for the first direct-drive RF power supply 101A through a connection 121A. Similarly, the controller 113 is connected to transmit waveform generator control signals for the second direct-drive RF power supply 101B through a connection 121B. The controller 113 is connected to transmit signal generator control signals for the first direct-drive RF power supply 101A through a connection 123A. Similarly, the controller 113 is connected to transmit signal generator control signals for the second direct-drive RF power supply 101B through a connection 123B. The controller 113 is connected to transmit frequency input control signals for the first direct-drive RF power supply 101A through a connection 125A. Similarly, the controller 113 is connected to transmit frequency input control signals for the second direct-drive RF power supply 101B through a connection 125B. The controller 113 is connected to transmit reactive circuit control signals for at least one variable capacitor 104A within the first reactive circuit 103A through a connection 127A. Similarly, the controller 113 is connected to transmit reactive circuit control signals for at least one variable capacitor 104B within the first reactive circuit 103B through a connection 127B.

A resistance 115A is seen by an output O1 of the first direct-drive RF power supply 101A. The resistance 115A represents a combination of the resistance in the coil 105, the resistance presented by the plasma when present within the plasma processing chamber 111, and the resistance of the RF power transmission path from the output of the first direct-drive RF power supply 101A to the coil 105. Similarly, a resistance 115B is seen by an output O2 of the second direct-drive RF power supply 101B. The resistance 115B represents a combination of the resistance in the coil 105, the resistance presented by the plasma when present within the plasma processing chamber 111, and the resistance of the RF power transmission path from the output of the first direct-drive RF power supply 101B to the coil 105.

In some embodiments, a first voltage and current (VI) probe 117A is coupled to the output O1 of the first direct-drive RF power supply 101A, as indicated by a connection 116A. The VI probe 117A is a sensor that measures a complex current at the output O1, a complex voltage at the output O1, and a phase difference between the complex voltage and the complex current at the output O1. The complex current has a magnitude and a phase. Similarly, the complex voltage has a magnitude and a phase. The VI probe 117A is coupled to the controller 113 to transmit a feedback signal 129A to the controller 113. In some embodiments, a voltage (V) probe is used in place of the VI probe 117A. In these embodiments, a current (I) probe 119A is coupled to the output of the first reactive circuit 103A, as indicated by a connection 118A. In these embodiments, the V probe is a sensor that measures a time-varying complex voltage magnitude and phase at the output O1. The I probe 119A is a sensor that measures a time-varying complex current magnitude and phase at the output of the first reactive circuit 103A. The I probe 119A is coupled to the controller 113 to transmit a feedback signal 131A to the controller 113.

In some embodiments, a second voltage and current (VI) probe 117B is coupled to the output O2 of the second direct-drive RF power supply 101B, as indicated by a connection 116B. The VI probe 117B is a sensor that measures a complex current at the output O2, a complex voltage at the output O2, and a phase difference between the complex voltage and the complex current at the output O2. The complex current has a magnitude and a phase. Similarly, the complex voltage has a magnitude and a phase. The VI probe 117B is coupled to the controller 113 to transmit a feedback signal 129B to the controller 113. In some embodiments, a voltage (V) probe is used in place of the VI probe 117B. In these embodiments, a current (I) probe 119B is coupled to the output of the second reactive circuit 103B, as indicated by a connection 118B. In these embodiments, the V probe is a sensor that measures a time-varying complex voltage magnitude and phase at the output O2. The I probe 119B is a sensor that measures a time-varying complex current magnitude and phase at the output of the second reactive circuit 103B. The I probe 119B is coupled to the controller 113 to transmit a feedback signal 131B to the controller 113.

Figure 2:
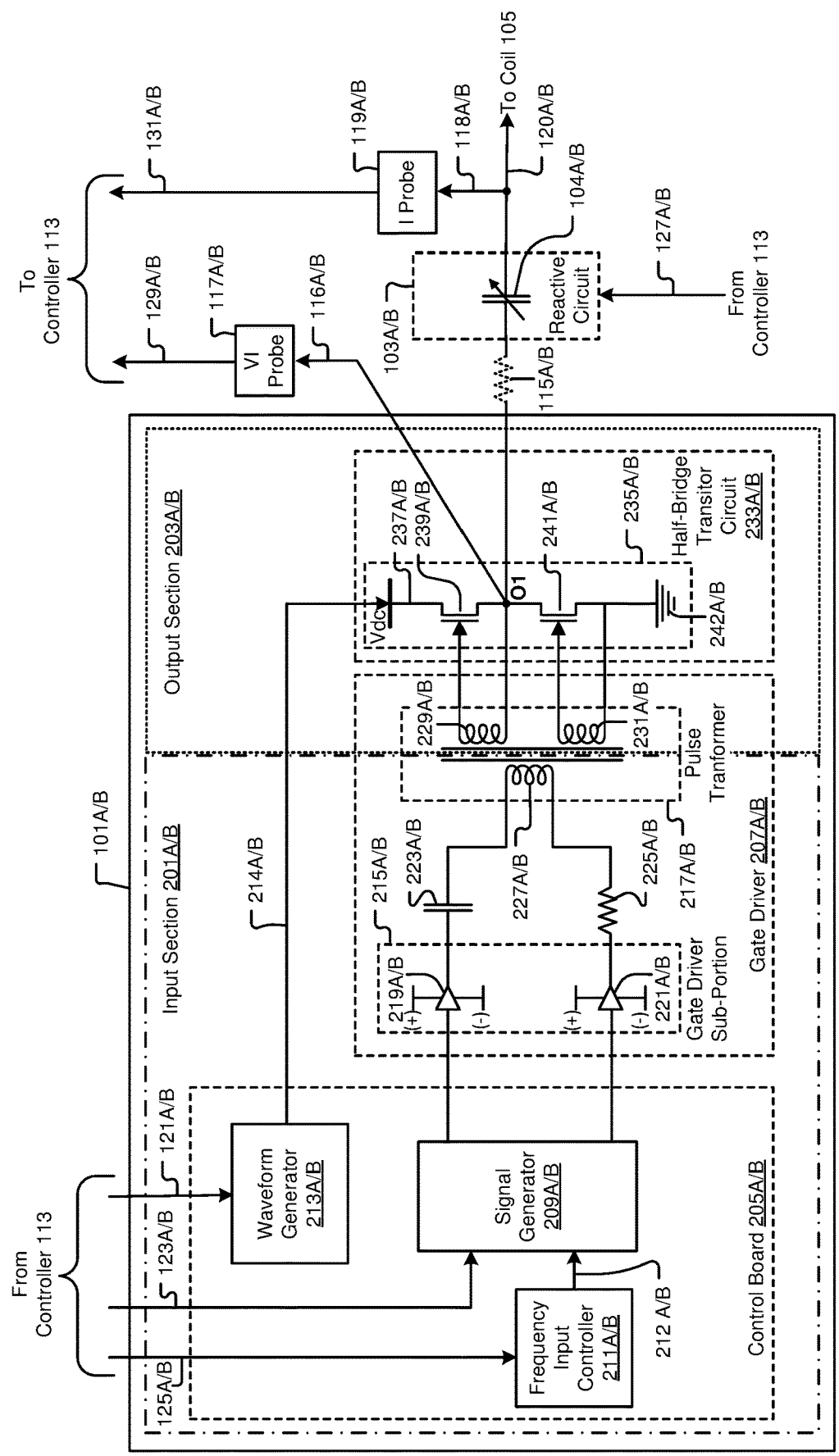
FIG. 2 shows a configuration schematic of each of the first direct-drive RF power supply and the second direct-drive RF power supply, in accordance with some embodiments.

FIG. 2 shows a configuration schematic of each of the first direct-drive RF power supply 101A and the second direct-drive RF power supply 101B, in accordance with some embodiments. It should be understood that the first direct-drive RF power supply 101A and the second direct-drive RF power supply 101B have the same configuration. In FIG. 2, the suffix "A" on a given reference numeral indicates that the component/feature corresponding to the given reference numeral is in the first direct-drive RF power supply 101A. Similarly, the suffix "B" on a given reference numeral indicates that the component/feature corresponding to the given reference numeral is in the second direct-drive RF power supply 101B. For example, the connection 121A/B represents the connection 121A that exists within the first direct-drive RF power supply 101A and the connection 121B that exists within the second direct-drive RF power supply 101B.

Each of the first direct-drive RF power supply 101A and the second direct-drive RF power supply 101B includes an input section 201A/B and an output section 203A/B. The input section 201A/B includes an electrical signal generator 209A/B and a portion of a gate driver 207A/B. The output section 203A/B includes a remaining portion of the gate driver 207A/B and a half-bridge transistor (e.g., field effect transistor (FET)) circuit 233A/B. The half-bridge transistor circuit 233A/B is also referred to as an amplification circuit/tree and is coupled to the gate driver 207A/B. In some embodiments, the input section 201A/B includes a controller board 205A/B on which the electrical signal generator 209A/B, a waveform generator 213A/B, and a frequency input controller 211A/B are implemented. The electrical signal generator 209A/B is connected to receive the signal generator control signals from the controller 113 through the connection 123A/B. The waveform generator 213A/B is connected to receive the waveform generator control signals from the controller 113 through the connection 121A/B. The frequency input controller 211A/B is connected to receive the frequency input control signals from the controller 113 through the connection 125A/B. The frequency input controller 211A/B is connected to supply frequency input to the electrical signal generator 209A/B through a connection 212A/B.

In some embodiments, an entirety of the gate driver 207A/B is implemented on the controller board 205A/B. The input section 201A/B generates multiple square wave signals and provides the square wave signals to the output section 203A/B. The output section 203A/B generates an amplified square waveform from the multiple square wave signals received from the input section 201A/B. The output section 203A/B also shapes an envelope, such as a peak-to-peak magnitude, of the amplified square waveform. For example, a shaping control signal 214A/B is supplied from a waveform generator 213A/B within the input section 201A/B to the half-bridge transistor circuit 233A/B within the output section 203A/B to generate the envelope. The shaping control signal 214A/B has multiple voltage values for shaping the amplified square waveform to generate a shaped-amplified square waveform. For the first direct-drive RF power supply 101A, the shaped-amplified square waveform is transmitted from the output section 203A to the first reactive circuit 103A. For the second direct-drive RF power supply 101B, the shaped-amplified square waveform is transmitted from the output section 203B to the second reactive circuit 103B.

Each of the first reactive circuit 103A and the second reactive circuit 103B removes, such as filters out, higher-order harmonics of the shaped-amplified square waveform to generate a shaped-sinusoidal waveform having a fundamental frequency. The shaped-sinusoidal waveform has the same envelope as the shaped-amplified square waveform. For the first direct-drive RF power supply 101A, RF power is transmitted from the first reactive circuit 103A to a first end of the coil 105 in the form of the shaped-sinusoidal waveform having the fundamental frequency. For the second direct-drive RF power supply 101B, RF power is transmitted from the second reactive circuit 103B to a second end of the coil 105 in the form of the shaped-sinusoidal waveform having the fundamental frequency. RF power transmitted to the coil 105 is transmitted into the plasma processing chamber 111 to transform one or more process gas(es) within the plasma processing chamber 111 into a plasma for processing of the wafer 109, as previously discussed with regard to FIG. 1.

In some embodiments, for the first direct-drive RF power supply 101A, a reactance of the first reactive circuit 103A is modified by transmitting a first quality factor control signal from the controller 113 through the connection 127A to the first reactive circuit 103A, where the first quality factor control signal directs implementation of a specific change in the reactance of the first reactive circuit 103A, such as by directing implementation of a change in a capacitance setting of at least one variable capacitor 104A within the first reactive circuit 103A. In some embodiments, for the second direct-drive RF power supply 101B, a reactance of the second reactive circuit 103B is modified by transmitting a second quality factor control signal from the controller 113 through the connection 127B to the second reactive circuit 103B, where the second quality factor control signal 127B directs implementation of a specific change in the reactance of the second reactive circuit 103B, such as by directing implementation of a change in a capacitance setting of at least one variable capacitor 104B within the second reactive circuit 103B.

In some embodiments, the feedback signal 129A/B is sent from the VI probe 117A/B to the controller 113. In some embodiments, the feedback signal 129A/B is used to determine a phase difference between the time-varying voltage and the time-varying current of the shaped-amplified square waveform at the output O1/O2 of the output section 203A/B to enable control of the output section 203A/B to reduce or eliminate the phase difference. In some embodiments, for the first direct-drive RF power supply 101A, either in addition to or instead of the feedback signal 129A, the feedback signal 131A is transmitted from the I probe 119A to the controller 113. In some embodiments, a phase difference between the time-varying voltage and the time-varying current of the shaped-sinusoidal waveform at the output O1 of the first reactive circuit 103A is determined from the feedback signal 131A to enable control of the output section 203A and/or control of the first reactive circuit 103A to reduce or eliminate the phase difference. In some embodiments, for the second direct-drive RF power supply 101B, either in addition to or instead of the feedback signal 129B, the feedback signal 131B is transmitted from the I probe 119B to the controller 113. In some embodiments, a phase difference between the time-varying voltage and the time-varying current of the shaped-sinusoidal waveform at the output O2 of the second reactive circuit 103B is determined from the feedback signal 131B to enable control of the output section 203B and/or control of the second reactive circuit 103B to reduce or eliminate the phase difference.

The electrical signal generator 209A/B is a square wave oscillator that generates a square wave signal, such as a digital waveform or a pulse train. The square wave signal output by the electrical signal generator 209A/B pulses between a first logic level, such as high (or one), and a second logic level, such as low (or zero). The electrical signal generator 209A/B generates the square wave signal at a prescribed operating frequency, such as 400 kiloHertz (kHz), or 2 MHz, or 13.56 MHz, or 27 MHz, or 60 MHz, among other operating frequencies, in accordance with frequency input supplied from the frequency input controller 211A/B to the electrical signal generator 209A/B.

The gate driver 207A/B includes a first portion within the input section 201A/B, which includes a gate driver sub-portion 215A/B, a capacitor 223A/B, a resistor 225A/B, and a primary winding 227A/B of a pulse transformer 217A/B. The gate driver 207A/B also includes a second portion within the output section 203A/B, which includes secondary windings 229A/B and 231A/B of the pulse transformer 217A/B. The gate driver sub-portion 215A/B includes multiple gate drivers 219A/B and 221A/B. Each of the gate drivers 219A/B and 221A/B is coupled to a positive voltage source (+) at one end and to a negative voltage source (−) at its opposite end.

In some embodiments, the half-bridge transistor circuit 233A/B includes a direct current (DC) rail 235A/B that includes a voltage source Vdc electrically connected to a first terminal of a first transistor 239A/B through a conductor 237A/B, with a second terminal of the first transistor 239A/B electrically connected to a first terminal of a second transistor 241A/B, and with a second terminal of the second transistor 241A/B electrically connected to a reference ground potential 242A/B. In this manner, the half-bridge transistor circuit 233A/B includes the first transistor 239A/B and the second transistor 241A/B coupled to each other in a push-pull configuration. In some embodiments, the first transistor 239A/B and the second transistor 241A/B are n-type FETs that turn on when at least a threshold voltage is applied their gate conductor. However, in other embodiments, the first transistor 239A/B and the second transistor 241A/B are p-type FETs that turn off when at least a threshold voltage is applied their gate conductor. In some embodiments, each of the first transistor 239A/B and the second transistor 241A/B is implemented as a metal oxide semiconductor field effect transistor (MOSFET). In some embodiments, first transistor 239A/B and the second transistor 241A/B are implemented as another type of transistor, such as an insulated gate bipolar transistor (IGBT), or a metal semiconductor field effect transistor (MESFET), or a junction field effect transistor (JFET), among others. In some embodiments, each of the first transistor 239A/B and the second transistor 241A/B is made from silicon carbide, or silicon, or gallium nitride. Each of the first transistor 239A/B and the second transistor 241A/B has an output impedance that lies within a pre-determined range, such as within a range extending from about 0.01 Ohm to about 10 Ohms. The output O1 of the first direct-drive RF power supply 101A is the node connection between the second terminal (source terminal) of the first transistor 239A and the first terminal (drain terminal) of the second transistor 241A. Similarly, the output O2 of the second direct-drive RF power supply 101B is the node connection between the second terminal (source terminal) of the first transistor 239B and the first terminal (drain terminal) of the second transistor 241B.

The controller 113 is coupled to the frequency input controller 211A/B through the connection 125A/B to provide the frequency input (the operating frequency) to the electrical signal generator 209A/B. The controller 113 is further coupled to the waveform generator 213A/B to control the shaping control signal 214A/B provided to the DC rail 235A/B. The electrical signal generator 209A/B has respective outputs coupled to the gate drivers 219A/B and 221A/B. An output of the gate driver 219A/B is coupled to an input terminal of the capacitor 223A/B. An output of the gate driver 221A/B is coupled to an input terminal of the resistor 225A/B. The capacitor 223A/B is coupled to a first end of the primary winding 227A/B of the pulse transformer 217A/B. The resistor 225A/B is coupled to a second end of the primary winding 227A/B of the pulse transformer 217A/B. The capacitor 223A/B functions to cancel or negate an inductance of the primary winding 227A/B. The cancellation or negation of the inductance of the primary winding 227A/B facilitates generation of a square shape of the gate drive signals that are output by the gate drivers 219A/B and 221A/B. Also, the resistor 225A/B reduces an oscillation of the square wave signal that is generated by the electrical signal generator 209A/B.

A first end of the secondary winding 229A/B of the pulse transformer 217A/B is electrically connected to a gate terminal of the first transistor 239A/B. A second end of the secondary winding 229A/B is electrically connected to both the second terminal of the first transistor 239A/B and the first terminal of the second transistor 241A/B, which are both electrically connected to the output O1/O2 of the half-bridge transistor circuit 233A/B. A first end of the secondary winding 231A/B of the pulse transformer 217A/B is electrically connected to a gate terminal of the second transistor 241A/B. A second end of the secondary winding 231A/B is electrically connected to the reference ground potential 242A/B. The output O1/O2 of the half-bridge transistor circuit 233A/B is electrically connected to the input of the first/second reactive circuit 103A/B. The resistance 115A/B is seen by the output O1/O2 of the half-bridge transistor circuit 233A/B. The resistance 115A/B represents a combination of the resistance in the coil 105 to which the first/second direct-drive RF power supply 101A/B is connected, the resistance presented by the plasma when present within the plasma processing chamber 111, and the resistance of the RF power transmission path from the output O1/O2 to the coil 105.

The controller 113 generates a setting, such as the frequency input that is provided to the electrical signal generator 209A/B by way of the frequency input controller 211A/B. The frequency input is the value, such as 2 MHz, 13.56 MHz, etc., of the target operating frequency. The electrical signal generator 209A/B generates an input RF signal having the target operating frequency. The input RF signal is the square wave signal. The gate drivers 219A/B and 221A/B amplify the input RF signal to generate an amplified RF signal and provide the amplified RF signal to the primary winding 227A/B of the pulse transformer 217A/B.

Based on a directionality of electrical current flow of the amplified RF signal at a given time, either the secondary winding 229A/B or the secondary winding 231A/B generates a gate drive signal having a threshold voltage at the given time. For example, when the electrical current of the amplified RF signal flows from a positively charged terminal of the primary winding 227A/B to a negatively charged terminal of the primary winding 227A/B, the secondary winding 229A/B generates a gate drive signal having at least the threshold voltage to turn on the first transistor 239A/B, and the secondary winding 231A/B does not generate the threshold voltage such that the second transistor 241A/B is off. Conversely, when the current of the amplified RF signal flows from the negatively charged terminal of the primary winding 227A/B to the positively charged terminal of the primary winding 227A/B, the secondary winding 231A/B generates a gate drive signal having at least the threshold voltage to turn on the second transistor 241A/B, and the secondary winding 229A/B does not generate the threshold voltage such that the first transistor 239A/B is off.

Each gate drive signal that is transmitted to the gate of the first transistor 239A/B and the gate of the second transistor 241A/B is a square wave signal, e.g., a digital signal or a pulsed signal, having the target operating frequency. For example, each gate drive signal that is transmitted to the gate of the first transistor 239A/B and the gate of the second transistor 241A/B transitions between a low level and a high level. The gate drive signals that are transmitted to the gate of the first transistor 239A/B and the gate of the second transistor 241A/B have the target operating frequency and are in reverse synchronization with respect to each other. More specifically, during a time interval or a time at which the gate drive signal that is transmitted to the gate of the first transistor 239A/B transitions from the low level to the high level, the gate drive signal that is transmitted to the gate of the second transistor 241A/B simultaneously transitions from the high level to the low level. Similarly, during a time interval or a time in which the gate drive signal that is transmitted to the gate of the first transistor 239A/B transitions from the high level to the low level, the gate drive signal that is transmitted to the gate of the second transistor 241A/B simultaneously transitions from the low level to the high level. This reverse synchronization of the gate drive signals allows the first transistor 239A/B and the second transistor 241A/B to be turned on consecutively and to be turned off consecutively in a repeating manner in accordance with the target operating frequency of the time-varying square wave signal. The first transistor 239A/B and the second transistor 241A/B are consecutively operated. For example, when the first transistor 239A/B is turned on, the second transistor 241A/B is turned off. And, when the second transistor 241A/B is turned on, the first transistor 239A/B is turned off. The first transistor 239A/B and the second transistor 241A/B are not on at the same time or during the same time period. At frequencies other than the target operating frequency, the first/second reactive circuit 103A/B functions to present a high load so that not much current will come out of the first/second direct-drive RF power supply 101A/B at other non-target frequencies.

When the first transistor 239A/B is on and the second transistor 241A/B is off, electrical current flows between the voltage source Vdc and the output O1/O2 to generate a voltage at the output O1/O2. The voltage at the output O1/O2 is generated according to the shaping control signal 214A/B received from the controller 113 by way of the waveform generator 213A/B. When the second transistor 241A/B is off, there is no electrical current flowing from the output O1/O2 to the reference ground potential 242A/B that is connected to the second terminal of the second transistor 241A/B. Electrical current flows from the voltage source Vdc through the output O1/O2 of the half-bridge transistor circuit 233A/B to the input of the first/second reactive circuit 103A/B when the first transistor 239A/B is on. Also, when the second transistor 241A/B is on and the first transistor 239A/B is off, electrical current flows from the output O1/O2 of the half-bridge transistor circuit 233A/B to the reference ground potential 242A/B connected to the second terminal of the second transistor 241A/B. When the first transistor 239A/B is off, there is no electrical current flowing from the voltage source Vdc to the output O1/O2 of the half-bridge transistor circuit 233A/B.

In some embodiments, the controller 113 directs the waveform generator 213A/B to generate the shaping control signal 214A/B that indicates voltage values used to control the DC rail 235A/B. The shaping control signal 214A/B is transmitted through an electrical conductor to the voltage source Vdc. The DC rail 235A/B is agile in that there is fast control of the voltage source Vdc by the controller 113 (and, optionally, by the waveform generator 213A/B). Both the controller 113 and the voltage source Vdc are electronic circuits, which allow the controller 113 to substantially instantaneously control the voltage source Vdc. For example, at a time the controller 113 sends (either directly or by way of the waveform generator 213A/B) the voltage values in the shaping control signal 214A/B to the voltage source Vdc, the voltage source Vdc substantially instantaneously changes its output voltage level accordingly. In some embodiments, the voltage values indicated by the shaping control signal 214A/B are within a range extending from about zero volt to about 80 volts, such that the DC rail 235A/B operates within this voltage range. The voltage values indicated by the shaping control signal 214A/B are magnitudes of the voltage signal that is generated by the voltage source Vdc to define the shaped envelope of the shaped-amplified square waveform at the output O1/O2 of the half-bridge transistor circuit 233A/B, i.e., at the output of the first/second direct-drive RF power supply 101A/B. For example, when the first/second direct-drive RF power supply 101AB is operated to generate a continuous waveform, the voltage values indicated by the shaping control signal 214A/B control, as a function of time, a peak-to-peak magnitude of a parameter of the continuous waveform generated at the output O1/O2 of the half-bridge transistor circuit 233A/B, where the parameter is one or more of power, voltage, and current, by way of example. The peak-to-peak magnitude of the continuous waveform defines the shaped envelope of the continuous waveform as a function of time at the output O1/O2 of the half-bridge transistor circuit 233A/B.

In another example, when the first/second direct-drive RF power supply 101A/B is operated to generate the shaped-amplified square waveform at the output O1/O2 of the half-bridge transistor circuit 233A/B to have a shaped envelope that is pulsed shape, the voltage values indicated by the shaping control signal 214A/B are changed substantially instantaneously (in a step-function-like manner) at a given time or during a given pre-determined time period, such that the peak-to-peak magnitude of the shaped-amplified square waveform changes from a first parameter level (e.g., high level) to a second parameter level (e.g., low level) or changes from the second parameter level to the first parameter level, where the parameter is one or more of power, voltage, and current, by way of example. In another example, when the first/second direct-drive RF power supply 101A/B is operated to generate the shaped-amplified square waveform at the output O1/O2 of the half-bridge transistor circuit 233A/B to have a shaped envelope that is of arbitrary shape, the voltage values indicated by the shaping control signal 214A/B are changed in a prescribed and controlled arbitrary manner as directed by the controller 113 by way of the waveform generator 213A/B, such that the peak-to-peak magnitude of the shaped-amplified square waveform changes in the prescribed and controlled arbitrary manner. In another example, when the first/second direct-drive RF power supply 101A/101B is operated to generate the shaped-amplified square waveform at the output O1/O2 of the half-bridge transistor circuit 233A/B to have a multi-state pulsed shape, the voltage values indicated by the shaping control signal 214A/B are changed substantially instantaneously (in a step-function-like manner) at a given time or during a given pre-determined time period, such that the peak-to-peak magnitude of the shaped-amplified square waveform changes between different states, where each of the different states has a different peak-to-peak magnitude of particular parameter level, e.g., power level, voltage level, and/or current level, among others. In various embodiments, the number of different states is two or more, as specified by the controller 113.

The shaped-amplified square waveform generated at the output O1/O2 of the half-bridge transistor circuit 233A/B is based on operation (as a function of time) of the first transistor 239A/B and the second transistor 241A/B in accordance with the gate drive signals as output by the gate drivers 219A/B and 221A/B, and supply (as a function of time) of voltage by the voltage source Vdc in accordance with the shaping control signal 214A/B. An amount of amplification of the shaped-amplified square waveform is based on the output impedances of the first transistor 239A/B and the second transistor 241A/B of the half-bridge transistor circuit 233A/B, the voltage values that are supplied by the controller 113 (and, optionally, by the waveform generator 213A/B) to the voltage source Vdc in the shaping control signal 214A/B, and a maximum achievable voltage value of the voltage source Vdc. The first/second reactive circuit 103A/B receives the shaped-amplified square waveform and functions to reduce or eliminate the higher-order harmonics of the shaped-amplified square waveform to generate the shaped-sinusoidal waveform having a fundamental frequency. It should be understood that the shaped-sinusoidal waveform that is output by the first/second reactive circuit 103A/B has the same shaped envelope as the shaped-amplified square waveform that is input to the first/second reactive circuit 103A/B. The shaped-sinusoidal waveform that is output by the first/second reactive circuit 103A/B is provided to the coil 105 as an RF signal for generation of the plasma within the plasma processing chamber 111.

In some embodiments, the VI probe 117A/B measures the complex voltage and complex current of the shaped-amplified square waveform at the output O1/O2 of the half-bridge transistor circuit 233A/B and provides the corresponding feedback signal to the controller 113 through the connection 129A/B, where the feedback signal indicates the complex voltage and complex current. The controller 113 identifies the phase difference between the complex voltage of the shaped-amplified square waveform and the complex current of the shaped-amplified square waveform from the feedback signal, and determines whether the phase difference is within a predetermined acceptable range. For example, the controller 113 determines whether or not the phase difference is zero or within a predetermined acceptable range (percentage) away from zero. Upon determining that the phase difference is not within the predetermined acceptable range, the controller 113 changes frequency values of the operating frequency to change the frequency input provided to the electrical signal generator 209A/B by way of the frequency input controller 211A/B. The changed frequency values are provided from the frequency input controller 211A/B to the electrical signal generator 209A/B to change the operating frequency of the electrical signal generator 209A/B. In some embodiments, the operating frequency is changed in less than or equal to about 10 microseconds. The operating frequency of the electrical signal generator 209A/B is changed until the controller 113 determines that the phase difference between the complex voltage and the complex current that is measured by the VI probe 117A/B is within the predetermined acceptable range. Upon determining that the phase difference between the complex voltage and the complex current is within the predetermined acceptable range, the controller 113 does not further change the frequency input to the electrical signal generator 209A/B. When the phase difference is within the predetermined acceptable range, a predetermined amount of power is provided from the output O1/O2 of the first/second direct-drive RF power supply 101A/B through the first/second reactive circuit 103A/B to the coil 105.

In some embodiments, in addition to or instead of changing the frequency input to the electrical signal generator 209A/B, the controller 113 changes the voltage values in the shaping control signal 214A/B that is being supplied to the voltage source Vdc in order to change the voltage signal generated by the voltage source Vdc. The voltage source Vdc changes its voltage level in accordance with the voltage values indicated in the shaping control signal 214A/B. The controller 113 continues to change the voltage values in the shaping control signal 214A/B until the shaped-amplified square waveform achieves a predetermined power setpoint. In some embodiments, the predetermined power setpoint is stored in a memory device of the controller 113. In various embodiments, instead of changing a voltage of the shaped-amplified square waveform at the output O1/O2, a current of the shaped-amplified square waveform is changed. For example, by directing changes in the voltage values in the shaping control signal 214A/B, the controller 113 changes the current of the shaped-amplified square waveform at the output O1/O2 until the shaped-amplified square waveform achieves a predetermined current setpoint. In some embodiments, the predetermined current setpoint is stored in the memory device of the controller 113. In some embodiments, instead of changing a voltage or a current of the shaped-amplified square waveform at the output O1/O2, a power of the shaped-amplified square waveform is changed. For example, by directing changes in the voltage values in the shaping control signal 214A/B, the controller 113 changes the power of the shaped-amplified square waveform at the output O1/O2 until the shaped-amplified square waveform achieves a predetermined power setpoint. In some embodiments, the predetermined power setpoint is stored in the memory device of the controller 113. It should be noted that any change in the voltage, current, or power of the shaped-amplified square waveform generated at the output O1/O2 produces the same change in the voltage, current, or power, respectively, of the shaped-sinusoidal waveform that is output by the first/second reactive circuit 103A/B.

In some embodiments, the controller 113 is coupled through a motor driver and a motor (e.g., stepper motor) to the first/second reactive circuit 103A/B. In some embodiments, the motor driver is implemented as an integrated circuit device that includes one or more transistors. The controller 113 sends a quality factor control signal through the connection 127A/B to the motor driver within the first/second reactive circuit 103A/B to in turn direct generation of an electrical signal that is transmitted from the motor driver to the motor. The motor operates in accordance with the electrical signal received from the motor driver to change a reactance of the first/second reactive circuit 103A/B. For example, in some embodiments, the motor operates to change an area (or spacing) between electrically conductive plates within the variable capacitor 104A/B to change the reactance of the first/second reactive circuit 103A/B. In some embodiments, the reactance of the first/second reactive circuit 103A/B is changed to maintain a prescribed quality factor of the first/second reactive circuit 103A/B.

The first/second reactive circuit 103A/B in combination with an inductance of the coil 105 has a high quality factor (Q). For example, an amount of power of the shaped-amplified square waveform generated at the output O1/O2 that is lost in the first/second reactive circuit 103A/B is low compared to an amount of power of the shaped-sinusoidal waveform that is transmitted from the output of the first/second reactive circuit 103A/B to the coil 105. The high quality factor of the first/second reactive circuit 103A/B facilitates fast ignition of the plasma within the plasma processing chamber 111. Also, the first/second reactive circuit 103A/B is configured and set to resonate out an inductive reactance of the coil 105 and the plasma, such that the output O1/O2 of the first/second direct-drive RF power supply 101A/B sees the resistance 115A/B, but essentially does not see any reactance. For example, the first reactive circuit 103A is controlled to have a reactance that reduces, such as nullifies or cancels, a reactance of the coil 105, the plasma, and the RF power transmission connections between the first reactive circuit 103A and the coil 105. In some embodiments, the reactance of the first reactive circuit 103A is controlled by controlling the capacitance setting of the variable capacitor 104A. Similarly, the second reactive circuit 103B is controlled to have a reactance that reduces, such as nullifies or cancels, a reactance of the coil 105, the plasma, and the RF power transmission connections between the second reactive circuit 103B and the coil 105. In some embodiments, the reactance of the second reactive circuit 103B is controlled by controlling the capacitance setting of the variable capacitor 104B.

In some embodiments, the first transistor 239A/B and the second transistor 241A/B are fabricated from silicon carbide to have a low internal resistance and fast switching time, and to facilitate cooling of the first transistor 239A/B and the second transistor 241A/B. The low internal resistance of the silicon carbide first transistor 239A/B and the silicon carbide second transistor 241A/B reduces an amount of heat generated by the first transistor 239A/B and the second transistor 241A/B, which makes it easier to cool the first transistor 239A/B and the second transistor 241A/B using a cooling plate or a heat sink. Also, the low internal resistance of the first transistor 239A/B and the second transistor 241A/B provides for higher efficiency, which enables the first transistor 239A/B and the second transistor 241A/B to turn on nearly instantaneously and to turn off fast, such as in less than 10 microseconds. In some embodiments, each of the first transistor 239A/B and the second transistor 241A/B is configured to turn on and off in less than a pre-determined time period, such as less than 10 microseconds. In some embodiments, each of the first transistor 239A/B and the second transistor 241A/B is configured to turn on and off in a time period extending from about 0.5 microsecond to about 10 microseconds. In some embodiments, each of the first transistor 239A/B and the second transistor 241A/B is configured to turn on and off in a time period extending from about 1 microsecond to about 5 microseconds. In some embodiments, each of the first transistor 239A/B and the second transistor 241A/B is configured to turn on and off in a time period extending from about 3 microseconds to about 7 microseconds. It should be understood that there is essentially no delay in transition between the on and off states for each of the first transistor 239A/B and the second transistor 241A/B. In this manner, when the first transistor 239A/B turns on, the second transistor 241A/B essentially simultaneously turns off. And, when the first transistor 239A/B turns off, the second transistor 241A/B essentially simultaneously turns on. The first transistor 239A/B and the second transistor 241A/B are configured to switch on and off fast enough to ensure that the first transistor 239A/B and the second transistor 241A/B will not be on at the same time in order to avoid electrical current flow directly from the voltage source Vdc to the reference ground potential 242A/B through the first transistor 239A/B and the second transistor 241A/B.

It should be understood that the components, such as transistors, of the first/second direct-drive RF power supply 101A/B are electronic. Also, it should be understood that there is no RF impedance matching network and no RF cable in the RF power transmission path from the first/second direct-drive RF power supply 101A/B to the coil 105. The electronic components within the first/second direct-drive RF power supply 101A/B in combination with the absence of the RF impedance matching network and the absence of the RF cable in the RF power transmission path from the first/second direct-drive RF power supply 101A/B to the coil 105 provides for repeatability and consistency in regard to fast plasma ignition and plasma sustainability across/between different plasma processing chambers 111.

Figure 3:
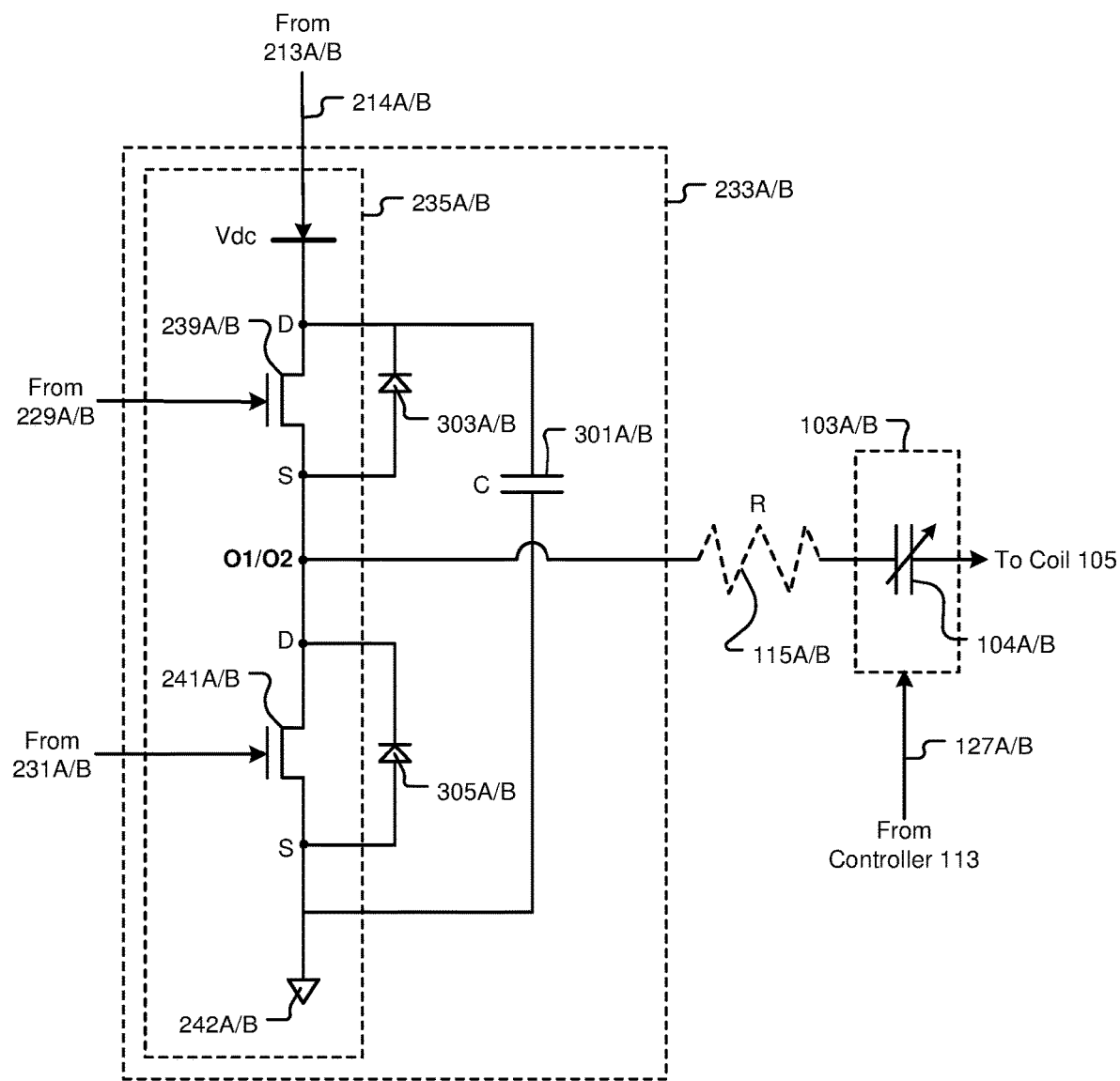
FIG. 3 shows a circuit schematic of the half-bridge transistor circuit that implements voltage limiters across the first transistor and the second transistor, in accordance with some embodiments.

FIG. 3 shows a circuit schematic of the half-bridge transistor circuit 233A/B that implements voltage limiters across the first transistor 239A/B and the second transistor 241A/B, in accordance with some embodiments. A diode 303A/B is connected between the drain terminal (D) and the source terminal (S) of the first transistor 239A/B to limit voltage across the first transistor 239A/B. When the first transistor 239A/B is turned on and the second transistor 241A/B is turned off, voltage across the first transistor 239A/B increases until the voltage is limited by the diode 303A/B. The diode 303A/B functions to prevent electrical current from adversely shooting through the first transistor 239A/B directly from the voltage source Vdc to the reference ground potential 242A/B. Similarly, a diode 305A/B is connected between the drain terminal (D) and the source terminal (S) of the second transistor 241A/B to limit voltage across the second transistor 241A/B. When the second transistor 241A/B is turned on and the first transistor 239A/B is turned off, voltage across the second transistor 241A/B increases until the voltage is limited by the diode 305A/B. The diode 305A/B functions to prevent electrical current from adversely shooting through the second transistor 241A/B directly from the voltage source Vdc to the reference ground potential 242A/B. A capacitor 301A/B is connected between the drain terminal (D) of the first transistor 239A/B and the source terminal (S) of the second transistor 241A/B. In the event of a delay in turning off and on of the first transistor 239A/B and/or the second transistor 241A/B, electrical current will flow from the voltage source Vdc through the capacitor 301A/B to the reference ground potential 242A/B to reduce the probability of having an adverse and potentially damaging amount of electrical current flow through the output O1/O2 of the first/second direct-drive RF power supply 101A/B to the coil 105.

Figure 4A:
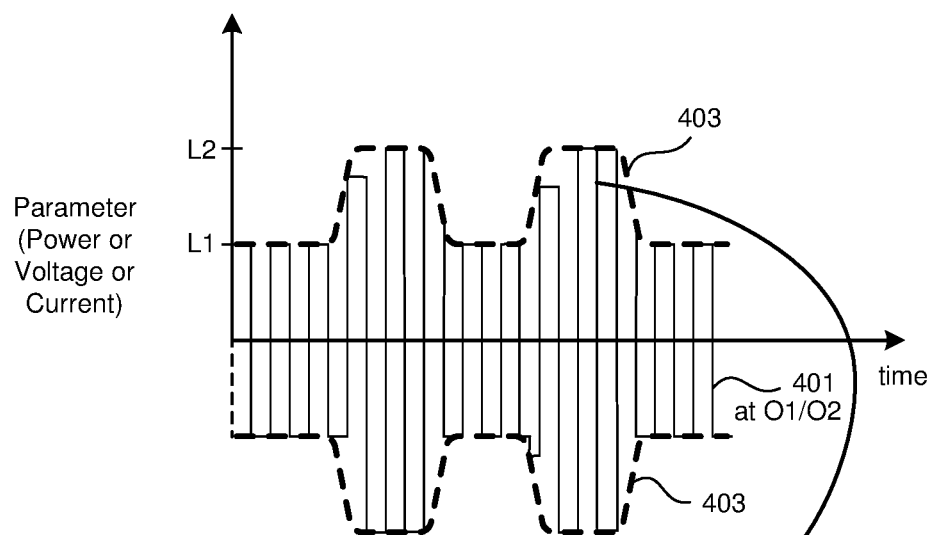
FIG. 4A shows a plot of a parameter of an example shaped-amplified square waveform generated at the output of the first/second direct-drive RF power supply as a function of time, in accordance with some embodiments.

FIG. 4A shows a plot of a parameter of an example shaped-amplified square waveform 401 generated at the output O1/O2 of the first/second direct-drive RF power supply 101A/B as a function of time, in accordance with some embodiments. The parameter of the shaped-amplified square waveform 401 is either power, voltage, or current. The shaped-amplified square waveform 401 has a shaped envelope 403 generated in accordance with the voltage values indicated by the shaping control signal 214A/B as directed by the controller 113 and/or waveform generator 213A/B. The shaped envelope 403 is controlled so that an absolute magnitude of the parameter of the shaped-amplified square waveform 401 transitions between a first level L1 (lower level) and a second level L2 (higher level). The parameter has a lower peak-to-peak magnitude at the first level L1 than at the second level L2. It should be understood that the shaped envelope 403 can have a different shape than what is shown in FIG. 4A, depending on the voltage values indicated by the shaping control signal 214A/B. For example, the shaping control signal 214A/B can be generated to direct the shaped envelope 403 to have a continuous wave shape, a triangular shape, a multi-level pulse shape, or essentially any other prescribed controlled arbitrary shape.

Figure 4B:
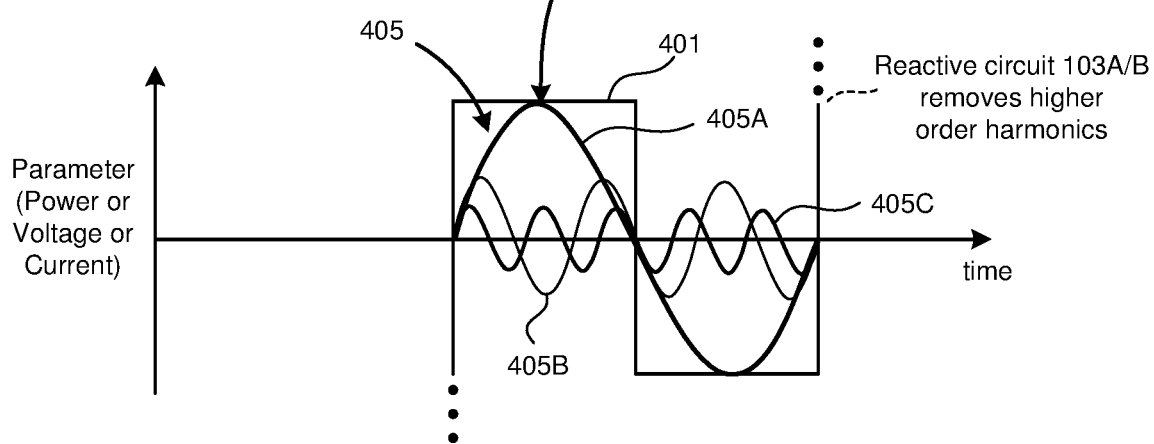
FIG. 4B shows a plot of a parameter of an example shaped-sinusoidal waveform generated at the output of the first/second reactive circuit as a function of time, in accordance with some embodiments.

FIG. 4B shows a plot of a parameter of an example shaped-sinusoidal waveform 405 generated at the output of the first/second reactive circuit 103A/B as a function of time, in accordance with some embodiments. The parameter of the shaped-sinusoidal waveform 405 is either power, voltage, or current. The shaped-sinusoidal waveform 405 is based on the shaped-amplified square waveform 401 that is input to the first/second reactive circuit 103A/B as a function of time. The shaped-amplified square waveform 401 is a combination of a fundamental frequency sinusoidal waveform 405A and multiple higher-order harmonic frequency sinusoidal waveforms 405B, 405C, etc. For example, the sinusoidal waveform 405B represents a second order harmonic frequency of the fundamental frequency sinusoidal waveform 405A. And, the sinusoidal waveform 405C represents a third order harmonic frequency of the fundamental frequency sinusoidal waveform 405A. The first/second reactive circuit 103A/B functions to remove the higher-order harmonic frequency sinusoidal waveforms 405B, 405C from the shaped-amplified square waveform 405, so that just the fundamental frequency sinusoidal waveform 405A is provided at the output of the first/second reactive circuit 103A/B as a function of time. The high quality factor of the first/second reactive circuit 103A/B facilitates removal of the higher-order harmonic frequency sinusoidal waveforms 405B, 405C, etc. from the shaped-amplified square waveform 401 that is output by the first/second direct-drive RF power supply 101A/B. The fundamental frequency sinusoidal waveform 405A is transmitted as the shaped-sinusoidal waveform to the coil 105, thereby transmitting RF power to the coil 105.

Figure 5A:
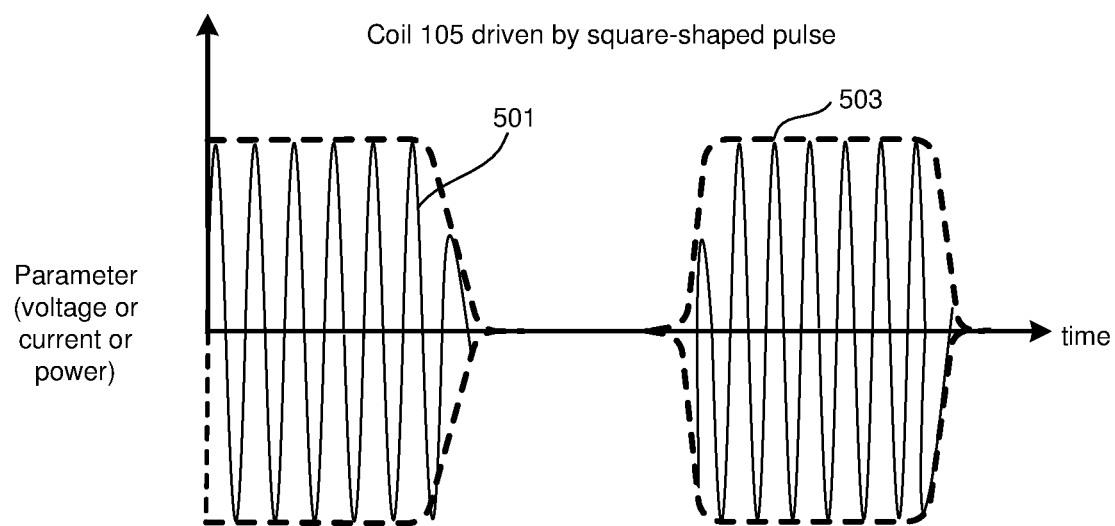
FIG. 5A shows a plot of a parameter of an example shaped-sinusoidal waveform generated at the output of the first/second reactive circuit as a function of time, in accordance with some embodiments.

FIG. 5A shows a plot of a parameter of an example shaped-sinusoidal waveform 501 generated at the output of the first/second reactive circuit 103A/B as a function of time, in accordance with some embodiments. The parameter of the shaped-sinusoidal waveform 501 is either power, voltage, or current. The shaped-sinusoidal waveform 501 has a shaped envelope 503 generated in accordance with the voltage values indicated by the shaping control signal 214A/B as directed by the controller 113 and/or waveform generator 213A/B. The shaped envelope 503 defines a peak-to-peak change in the parameter of the shaped-sinusoidal waveform 501 as a function of time. The example shaped envelope 503 represents a substantially square-shaped envelope, such as a pulse shaped envelope.

Figure 5B:
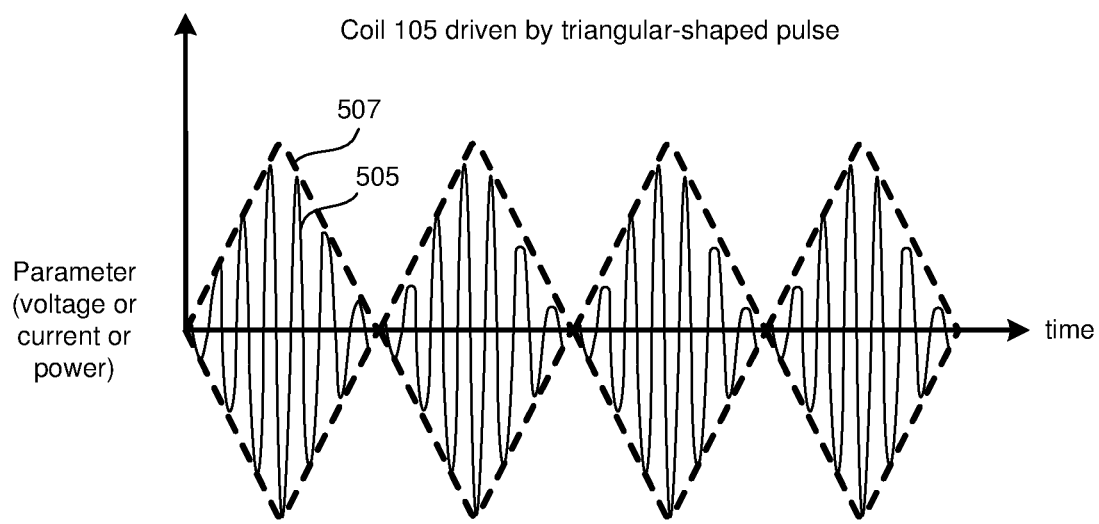
FIG. 5B shows a plot of a parameter of an example shaped-sinusoidal waveform generated at the output of the first/second reactive circuit as a function of time, in accordance with some embodiments.

FIG. 5B shows a plot of a parameter of an example shaped-sinusoidal waveform 505 generated at the output of the first/second reactive circuit 103A/B as a function of time, in accordance with some embodiments. The parameter of the shaped-sinusoidal waveform 505 is either power, voltage, or current. The shaped-sinusoidal waveform 505 has a shaped envelope 507 generated in accordance with the voltage values indicated by the shaping control signal 214A/B as directed by the controller 113 and/or waveform generator 213A/B. The shaped envelope 507 defines a peak-to-peak change in the parameter of the shaped-sinusoidal waveform 505 as a function of time. The example shaped envelope 505 represents a substantially triangular-shaped envelope.

Figure 5C:
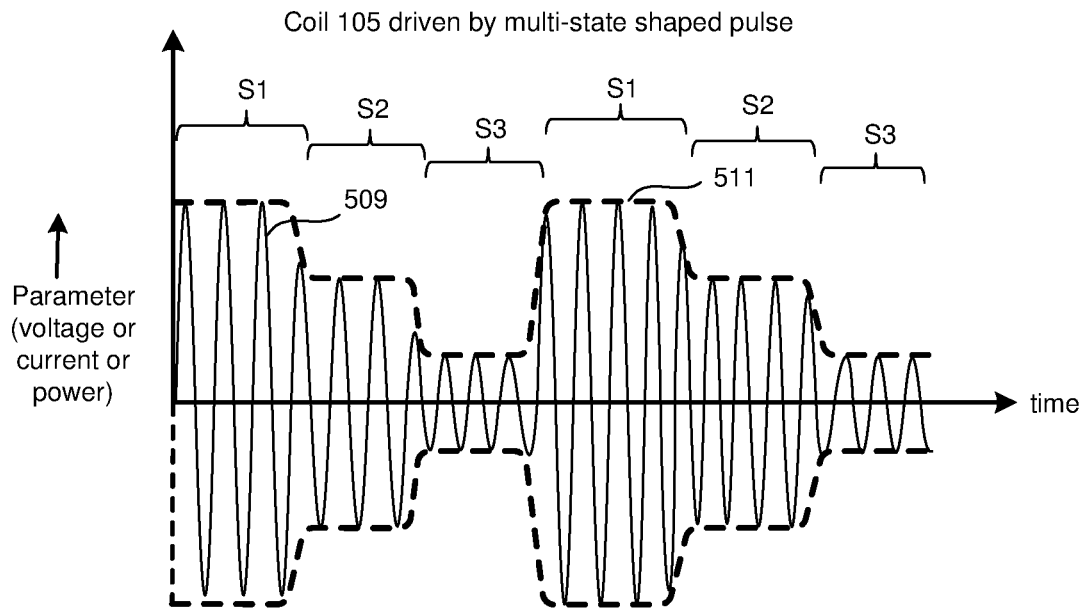
FIG. 5C shows a plot of a parameter of an example shaped-sinusoidal waveform generated at the output of the first/second reactive circuit as a function of time, in accordance with some embodiments.

FIG. 5C shows a plot of a parameter of an example shaped-sinusoidal waveform 509 generated at the output of the first/second reactive circuit 103A/B as a function of time, in accordance with some embodiments. The parameter of the shaped-sinusoidal waveform 509 is either power, voltage, or current. The shaped-sinusoidal waveform 509 has a shaped envelope 511 generated in accordance with the voltage values indicated by the shaping control signal 214A/B as directed by the controller 113 and/or waveform generator 213A/B. The shaped envelope 511 defines a peak-to-peak change in the parameter of the shaped-sinusoidal waveform 509 as a function of time. The example shaped envelope 511 represents a multi-state shaped envelope that includes three different states S1, S2, and S3. The shaped envelope 511 is defined so that the peak-to-peak change in the parameter of the shaped-sinusoidal waveform 509 during the first state S1 is greater than the peak-to-peak change in the parameter of the shaped-sinusoidal waveform 509 during the second state S2. The shaped envelope 511 is also defined so that the peak-to-peak change in the parameter of the shaped-sinusoidal waveform 509 during the second state S2 is greater than the peak-to-peak change in the parameter of the shaped-sinusoidal waveform 509 during the third state S3. The shaped envelope 511 reverts back to the first state S1 after the third state S3. The states S1, S2, and S3 repeat at a frequency that is less than the frequency of the shaped-amplified square waveform that is output by the first/second direct-drive RF power supply 101A/B. Therefore, the states S1, S2, and S3 repeat at a frequency that is less than the frequency of the shaped-sinusoidal waveform 509. In various embodiments, the multi-state shaped envelope includes more than three different states, with each different state corresponding to a different peak-to-peak change in the parameter of the shaped-sinusoidal waveform 509 as a function of time. Also, in various embodiments, the multi-state shaped envelope can be controlled so that any of the three or more different states of the shaped envelope has either a lower or higher peak-to-peak magnitude of the parameter of the shaped-sinusoidal waveform 509 relative to a next state of the shaped envelope.

Figure 5D:
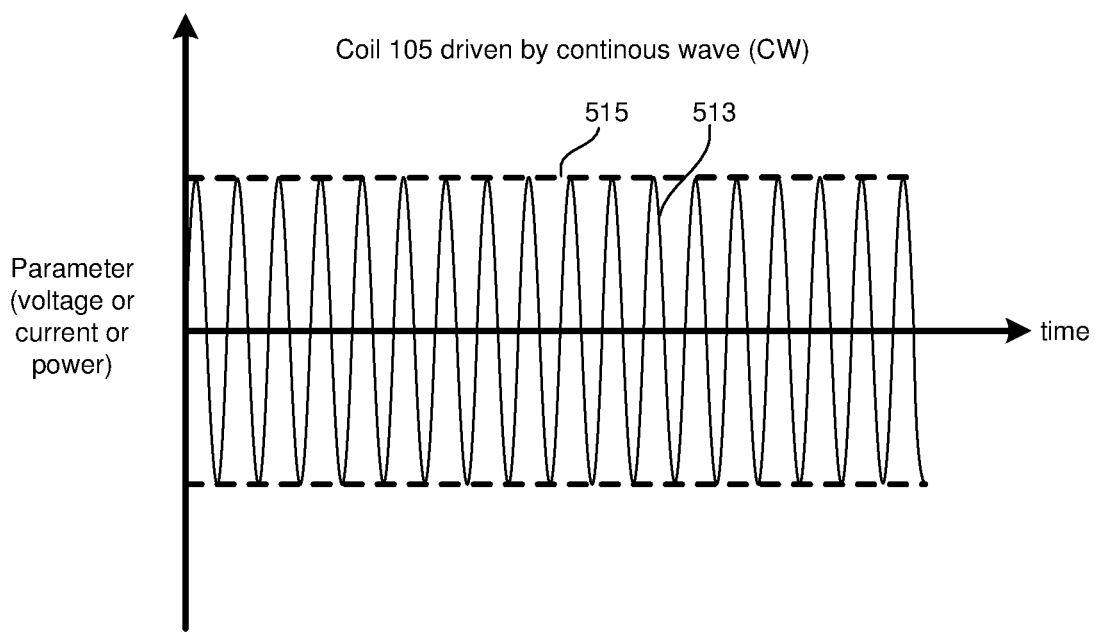
FIG. 5D shows a plot of a parameter of an example shaped-sinusoidal waveform generated at the output of the first/second reactive circuit as a function of time, in accordance with some embodiments.

FIG. 5D shows a plot of a parameter of an example shaped-sinusoidal waveform 513 generated at the output of the first/second reactive circuit 103A/B as a function of time, in accordance with some embodiments. The parameter of the shaped-sinusoidal waveform 513 is either power, voltage, or current. The shaped-sinusoidal waveform 513 has a shaped envelope 515 generated in accordance with the voltage values indicated by the shaping control signal 214A/B as directed by the controller 113 and/or waveform generator 213A/B. The shaped envelope 515 defines a peak-to-peak change in the parameter of the shaped-sinusoidal waveform 513 as a function of time. The example shaped envelope 515 is substantially flat, such that shaped-sinusoidal waveform 513 represents a continuous wave signal of substantially steady peak-to-peak magnitude.

Figure 6:
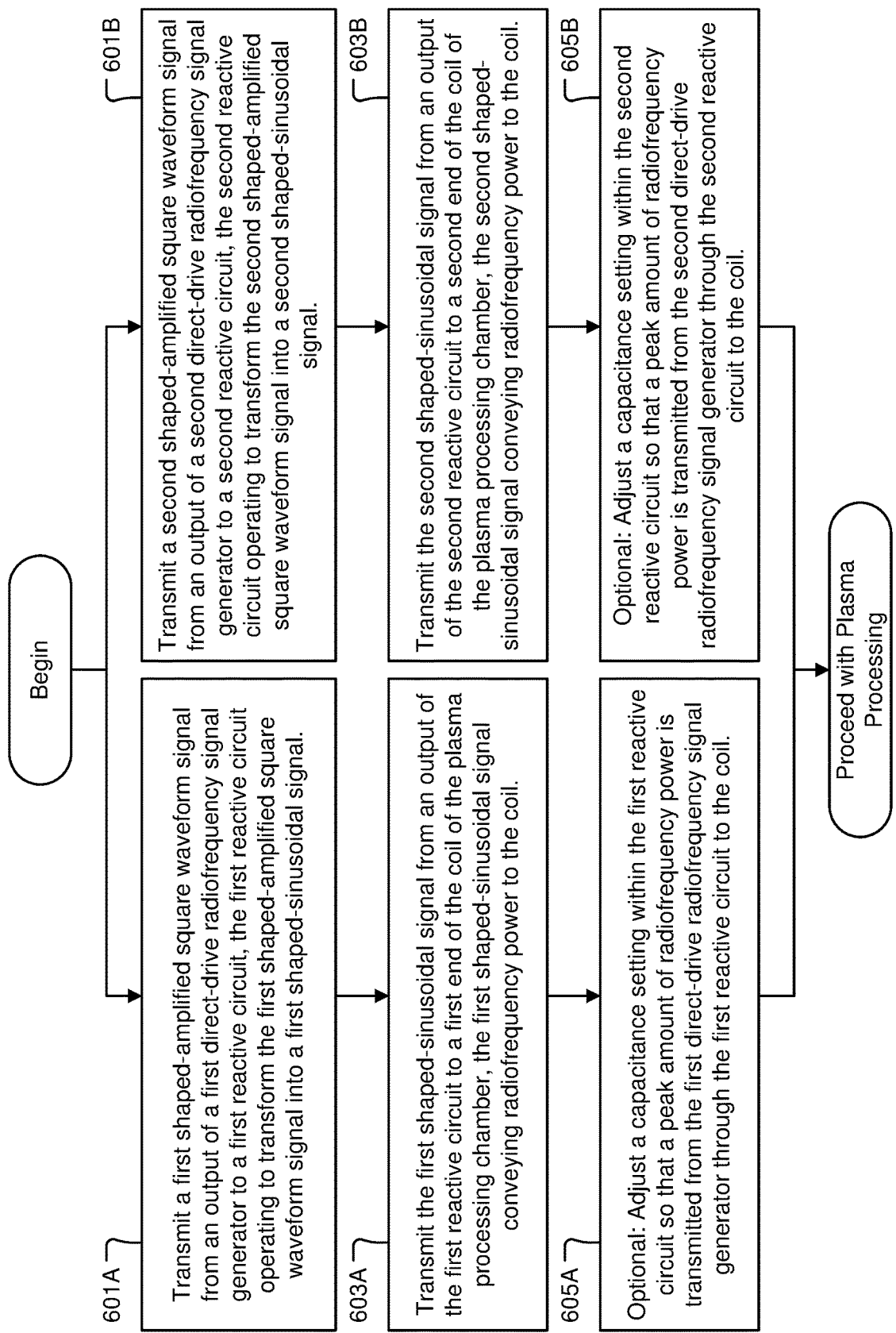
FIG. 6 shows a flowchart of a method for delivering RF power from the first/second direct-drive RF power supply to the plasma processing chamber, in accordance with some embodiments.

FIG. 6 shows a flowchart of a method for delivering RF power from the first/second direct-drive RF power supply 101A/B to the plasma processing chamber 111, in accordance with some embodiments. The method includes an operation 601A for transmitting a first shaped-amplified square waveform signal from an output of the first direct-drive RF power supply 101A to the first reactive circuit 103A, where the first reactive circuit 103A operates to transform the first shaped-amplified square waveform signal into a first shaped-sinusoidal signal. In some embodiments, the first direct-drive RF power supply 101A has a non-50 ohm output impedance. The method also includes an operation 603A for transmitting the first shaped-sinusoidal signal from the output of the first reactive circuit 103A to the first end of the coil 105 of the plasma processing chamber 111. The first shaped-sinusoidal signal conveys RF power to the coil 105.

The method also includes an optional operation 605A for adjusting a capacitance setting within the first reactive circuit 103A so that a peak amount of RF power is transmitted from the first direct-drive RF power supply 101A through the first reactive circuit 103A to the coil 105. In some embodiments, adjusting the capacitance setting in operation 605A essentially cancels an inductive part of a load to which the first direct-drive RF power supply 101A is connected by way of the coil 105 so that the load is primarily a resistive load. In some embodiments, adjusting the capacitance setting in operation 605A removes non-fundamental harmonic components of the first shaped-amplified square waveform signal that is transmitted from the output of the first direct-drive RF power supply 101A to the first reactive circuit 103A.

The method includes an operation 601B for transmitting a second shaped-amplified square waveform signal from an output of the second direct-drive RF power supply 101B to the second reactive circuit 103B, where the second reactive circuit 103B operates to transform the second shaped-amplified square waveform signal into a second shaped-sinusoidal signal. In some embodiments, the second direct-drive RF power supply 101B has a non-50 ohm output impedance. The method also includes an operation 603B for transmitting the second shaped-sinusoidal signal from the output of the second reactive circuit 103B to the second end of the coil 105 of the plasma processing chamber 111. The second shaped-sinusoidal signal conveys RF power to the coil 105.

The method also includes an optional operation 605B for adjusting a capacitance setting within the second reactive circuit 103B so that a peak amount of RF power is transmitted from the second direct-drive RF power supply 101B through the second reactive circuit 103B to the coil 105. In some embodiments, the operation 605B includes adjusting a capacitance setting of the variable capacitor 104B in the second reactive circuit 103B to substantially match a capacitance setting of the variable capacitor 104A in the first reactive circuit 103A. In some embodiments, adjusting the capacitance setting in operation 605B essentially cancels an inductive part of a load to which the second direct-drive RF power supply 101B is connected by way of the coil 105 so that the load is primarily a resistive load. In some embodiments, adjusting the capacitance setting in operation 605B removes non-fundamental harmonic components of the second shaped-amplified square waveform signal that is transmitted from the output of the second direct-drive RF power supply 101B to the second reactive circuit 103B. It should be understood that the method operations 601A, 601B, 603A, 603B, and optionally 605A and 605B, are performed in parallel with each other.

In some embodiments, the first shaped-amplified square waveform signal output by the first direct-drive RF powers supply 101A has a frequency of about 2 megaHertz (MHz) and the capacitance setting of the variable capacitor 104A in the first reactive circuit 103A is adjusted in the operation 605A within a range extending from about 2500 picofarads (pF) to about 4500 pF, and the second shaped-amplified square waveform signal output by the second direct-drive RF power supply 101B also has a frequency of about 2 MHz, with the capacitance setting of the variable capacitor 104B in the second reactive circuit 103B adjusted in the operation 605B to have substantially the same capacitance setting as the variable capacitor 104A in the first reactive circuit 103A. In some embodiments, the first shaped-amplified square waveform signal output by the first direct-drive RF power supply 101A has a frequency of about 13.56 MHz and the capacitance setting of the variable capacitor 104A in the second reactive circuit 103A is adjusted in the operation 605A within a range extending from about 5 pF to about 1000 pF, and the second shaped-amplified square waveform signal output by the second direct-drive RF power supply 101B also has a frequency of about 13.56 MHz, with the capacitance setting of the variable capacitor 104B in the second reactive circuit 103B adjusted in the operation 605B to have substantially the same capacitance setting as the variable capacitor 104A in the first reactive circuit 103A.

In some embodiments, the first direct-drive RF power supply 101A is configured to supply the first shaped-amplified square waveform signal having a frequency of about 2 MHz to the first end of the coil 105, and the second direct-drive RF power supply 101B is configured to simultaneously supply the second shaped-amplified square waveform signal also having a frequency of about 2 MHz to the second end of the coil 105. In some of these embodiments, the first reactive circuit 103A is configured to provide a capacitance between the output O1 of the first direct-drive RF power supply 101A and the first end of the coil 105 within a range extending from about 2500 pF to about 4500 pF, and the second reactive circuit 103B is configured to provide a capacitance between the output O2 of the second direct-drive RF power supply 1O1B and the second end of the coil 105 substantially equal to the capacitance provided by the first reactive circuit 103A. In some of these embodiments, the first reactive circuit 103A includes the variable capacitor 104A and a fixed capacitor connected in parallel with each other, and the second reactive circuit 103B includes the variable capacitor 104B and a fixed capacitor connected in parallel with each other. In some of these embodiments, the capacitance setting of each of the variable capacitors 104A and 104B is adjustable within a range extending from about 100 pF to about 2000 pF, and a capacitance of each of the fixed capacitors within the first reactive circuit 103A and the second reactive circuit 103B is within a range extending from about 2000 pF to about 3500 pF, with the second reactive circuit 103B being configured in a substantially equivalent manner as the first reactive circuit 103A.

In some embodiments, the first direct-drive RF power supply 101A is configured to supply the first shaped-amplified square waveform signal having a frequency of about 13.56 MHz to the first end of the coil 105, and the second direct-drive RF power supply 101B is configured to simultaneously supply the second shaped-amplified square waveform signal also having a frequency of about 13.56 MHz to the second end of the coil 105. In some of these embodiments, the first reactive circuit 103A is configured to provide a capacitance between the output O1 of the first direct-drive RF power supply 101A and the first end of the coil 105 within a range extending from about 5 pF to about 1000 pF, and the second reactive circuit 103B is configured to provide a capacitance between the output O2 of the second direct-drive RF power supply 101B and the second end of the coil 105 substantially equal to the capacitance provided by the first reactive circuit 103A.

In the plasma processing system 100, RF power is driven through the coil 105 in a substantially symmetric manner by the combination of the first direct-drive RF power supply 101A and the second direct-drive RF power supply 101B. The first direct-drive RF power supply 101A delivers one-half of the setpoint RF power to the coil 105, and the second direct-drive RF power supply 101B delivers one-half of the setpoint RF power to the coil 105. Connection of the first end of the coil 105 to the output O1 of the half-bridge transistor circuit 233A of the first direct-drive RF power supply 101A in conjunction with connection of the second end of the coil 105 to the output O2 of the half-bridge transistor circuit 233B of the second direct-drive RF power supply 101B enables the coil 105 to be driven at a specified RF power level using one-half of the DC rail 235A/B voltage (Vdc) that would otherwise be required if the coil 105 were driven by only one of the first direct-drive RF power supply 101A and the second direct-drive RF power supply 101B. For a given DC rail 235A/B voltage (Vdc), there will be a higher voltage on the coil 105. Therefore, by having opposite ends of the coil 105 symmetrically coupled to the first direct-drive RF power supply 101A and the second direct-drive RF power supply 101B, the plasma processing system 100 is able to double the RF power driven through the coil 105 for a given DC rail 235A/B voltage (Vdc). This enables the DC rail 235A/B to be operated at a lower voltage (Vdc) for a given RF power level, which is useful in satisfying (staying below) the maximum voltage ratings of the first transistor 239A/B and the second transistor 241A/B within the DC rail 235A/B. In some embodiments, with the first direct-drive RF power supply 101A and the second direct-drive RF power supply 101B symmetrically connected to supply RF power to the coil 105, the total RF power delivered to the coil 105 is greater than about 8 kiloWatts (kW) or greater than about 10 kW, without exceeding the voltage limits of the first transistor 239A/B and the second transistor 241A/B within the DC rail 235A/B. Also, the first reactive circuit 103A and the second reactive circuit 103B are configured to provide substantially equal capacitance levels in order to maintain a voltage balance across the coil 105. The symmetric coupling of the first direct-drive RF power supply 101A and the second direct-drive RF power supply 101B to the coil 105 is particularly beneficial in applications that have high inductance and low current.

Figure 7:
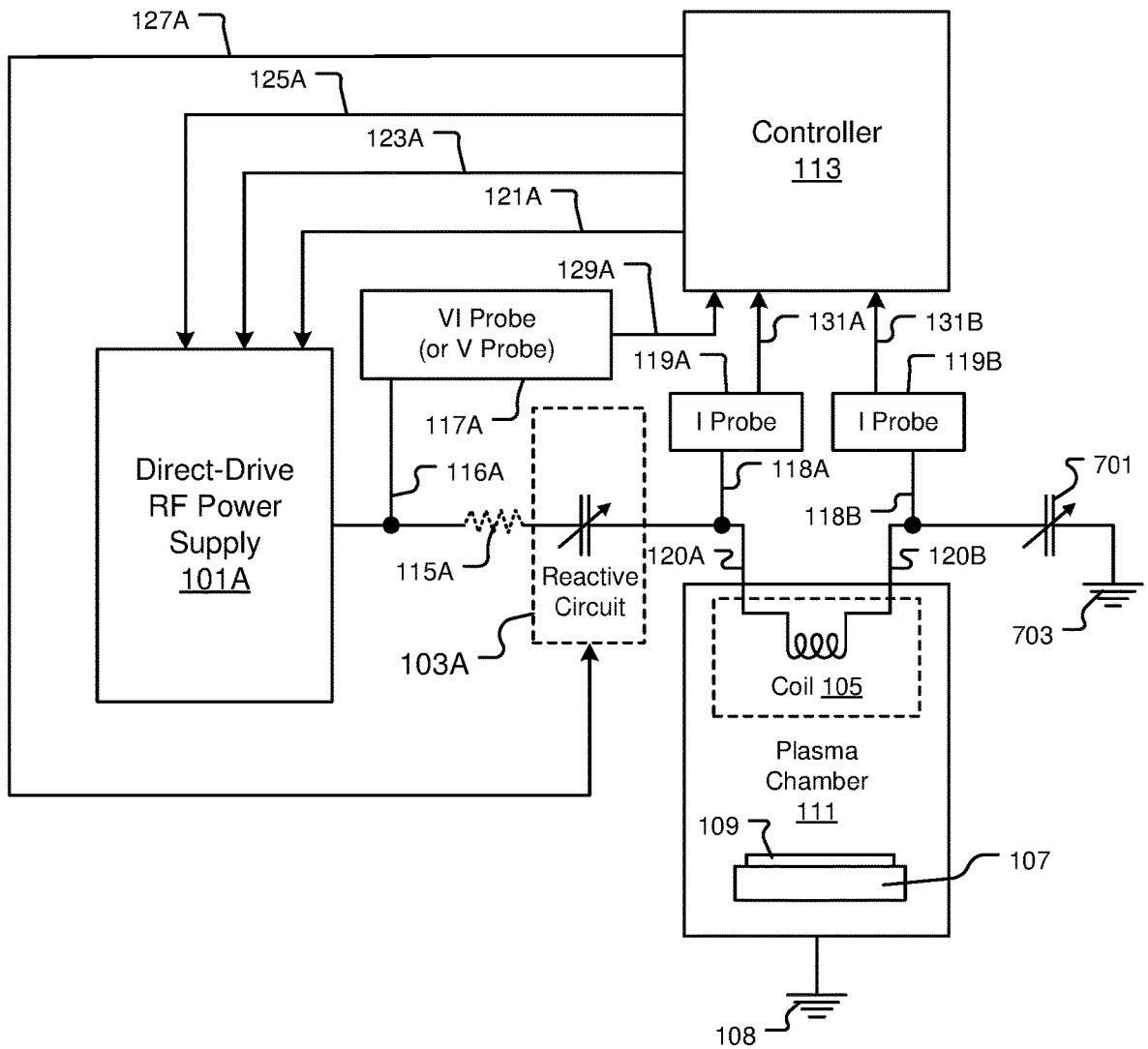
FIG. 7 shows a diagram of a plasma processing system that has the first direct-drive RF power supply connected to the first end of the coil and a variable capacitor connected to the second end of the coil, in accordance with some embodiments.

FIG. 7 shows a diagram of a plasma processing system 700 that has the first direct-drive RF power supply 101A connected to the first end of the coil 105 and a variable capacitor 701 connected to the second end of the coil 105, in accordance with some embodiments. In the plasma processing system 700, the variable capacitor 701 is substituted for the second direct-drive RF power supply 101B, as described with regard to FIGS. 1-6. The second end of the coil 105 is connected to a first terminal of the variable capacitor 701. A second terminal of the variable capacitor 701 is connected to a reference ground potential 703. In some embodiments, a capacitance setting of the variable capacitor 701 is adjusted to achieve voltage balance across the coil 105, such that a voltage at the first end of the coil 105 is substantially equal to a voltage at the second end of the coil 105. In some embodiments, a capacitance setting of the variable capacitor 701 is adjusted to achieve a balanced RF power feeding condition in which a reactance of the variable capacitor 701 is substantially equal to one-half of the reactance of the coil 105. In some embodiments, a capacitance setting of the variable capacitor 701 is adjusted to optimize (e.g., maximize) plasma density within the plasma processing chamber 111. In some embodiments, a capacitance setting of the variable capacitor 701 is adjusted to optimize (e.g., minimize) plasma potential within the plasma processing chamber 111. In some embodiments, a capacitance setting of the variable capacitor 701 is adjusted to optimize (e.g., minimize) a voltage drop across the plasma sheath within the plasma processing chamber 111. In some embodiments, a capacitance setting of the variable capacitor 701 is adjusted to optimize electron temperature within the plasma within the plasma processing chamber 111.

Figure 8:
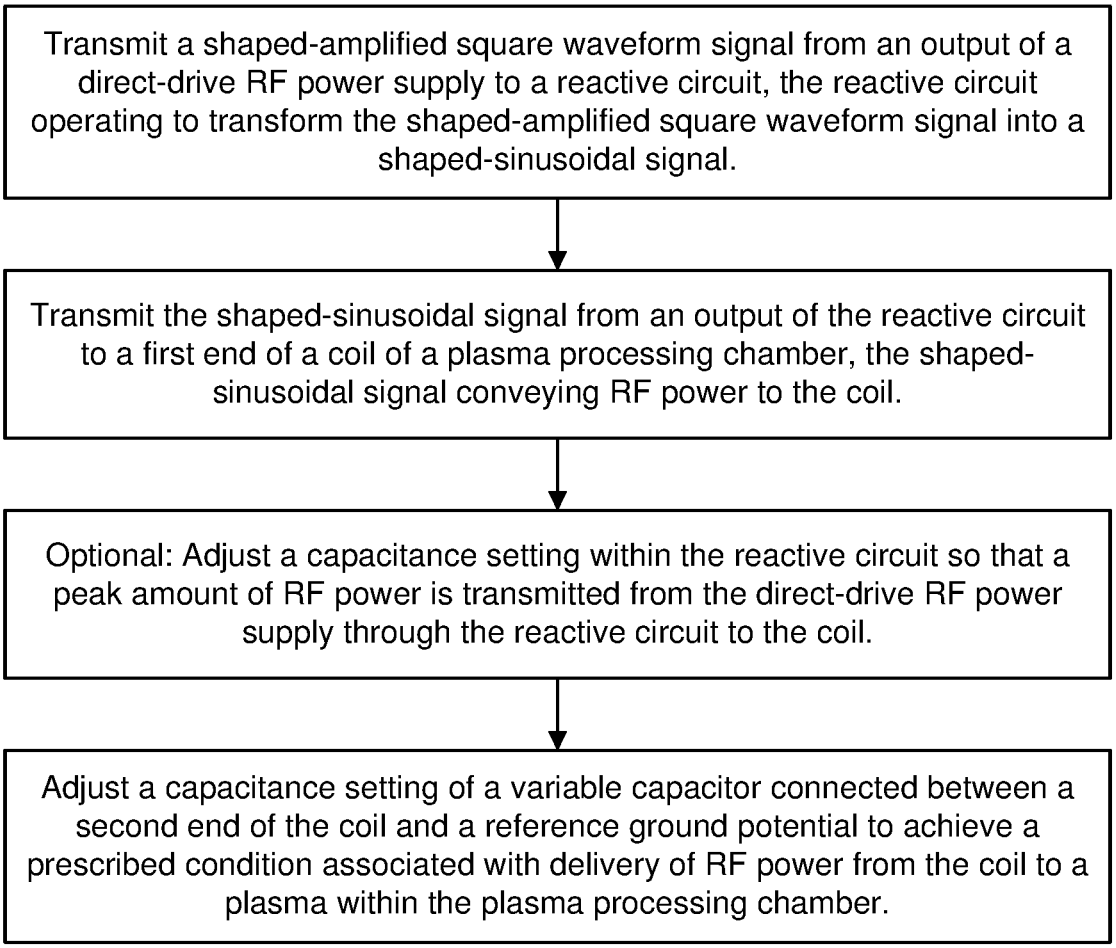
FIG. 8 shows a flowchart of a method for delivering RF power to the plasma processing chamber, in accordance with some embodiments.

FIG. 8 shows a flowchart of a method for delivering RF power to the plasma processing chamber 700, in accordance with some embodiments. The method includes an operation 801 for transmitting a shaped-amplified square waveform signal from an output of the first direct-drive RF power supply 101A to the first reactive circuit 103A, with the first reactive circuit 103A operating to transform the shaped-amplified square waveform signal into a shaped-sinusoidal signal. The method also includes an operation 803 for transmitting the shaped-sinusoidal signal from the output of the first reactive circuit 103A to the first end of the coil 105 of the plasma processing chamber 111, where the shaped-sinusoidal signal conveys RF power to the coil 105. The method also includes an optional operation 805 for adjusting a capacitance setting with the first reactive circuit 103A so that a peak amount of RF power is transmitted from the first direct-drive RF power supply 101A through the first reactive circuit 103A to the coil 105. The method also includes an operation 807 for adjusting a capacitance setting of the variable capacitor 701 connected between the second end of the coil 105 and the reference ground potential 703 to achieve a prescribed condition associated with delivery of RF power from the coil to the plasma within the plasma processing chamber 111. In some embodiments, the operation 807 is performed to achieve a substantial balance of voltage across the coil 105 (between the first and second ends of the coil 105). In some embodiments, the operation 807 is performed to achieve a balanced RF power feeding condition in which a reactance of the variable capacitor 701 is substantially equal to one-half of the reactance of the coil 105. In some embodiments, the operation 807 is performed to optimize (e.g., maximize) plasma density within the plasma processing chamber 111. In some embodiments, the operation 807 is performed to optimize (e.g., minimize) plasma potential within the plasma processing chamber 111. In some embodiments, the operation 807 is performed to optimize (e.g., minimize) a voltage drop across the plasma sheath within the plasma processing chamber 111. In some embodiments, the operation 807 is performed to optimize electron temperature within the plasma within the plasma processing chamber 111.

The various embodiments described herein may be practiced in conjunction with various computer system configurations including hand-held hardware units, microprocessor systems, microprocessor-based or programmable consumer electronics, minicomputers, mainframe computers and the like. The various embodiments described herein can also be practiced in conjunction with distributed computing environments where tasks are performed by remote processing hardware units that are linked through a computer network.

In some embodiments, a control system, e.g., host computer system, is provided for controlling the plasma processing systems 100 and 700. In various embodiments, the plasma processing systems 100 and 700 include semiconductor processing equipment, such as processing tool(s), chamber(s), platform(s) for processing, and/or specific processing components such as a wafer pedestal, a gas flow system, among other components. In various embodiments, the plasma processing systems 100 and 700 are integrated with electronics for controlling its operation before, during, and after processing of a semiconductor wafer or substrate, where the electronics are implemented within a controller that is configured and connected to control various components and/or sub-parts of the plasma processing systems 100 and 700. Depending on substrate/wafer processing requirements and/or the particular configuration of the plasma processing systems 100 and 700, the controller is programmed to control any process and/or component disclosed herein, including a delivery of process gas(es), temperature settings (e.g., heating and/or cooling), pressure settings, vacuum settings, power settings, first/second direct-drive RF power supply 101A/101B settings, first/second reactive circuit 103A/B settings, variable capacitor 701 settings, electrical signal frequency settings, gas flow rate settings, fluid delivery settings, positional and operation settings, substrate/wafer transfers into and out of the plasma processing chamber 111 and/or into and out of load locks connected to or interfaced with the plasma processing systems 100 and 700, among others.

Broadly speaking, in a variety of embodiments, the controller that is connected to control operations of the plasma processing systems 100 and 700 is defined as electronics having various integrated circuits, logic, memory, and/or software that direct and control various tasks/operations, such as receiving instructions, issuing instructions, controlling device operations, enabling cleaning operations, enabling endpoint measurements, enabling metrology measurements (optical, thermal, electrical, etc.), among other tasks/operations. In some embodiments, the integrated circuits within the controller include one or more of firmware that stores program instructions, a digital signal processors (DSP), an Application Specific Integrated Circuit (ASIC) chip, a programmable logic device (PLD), one or more microprocessors, and/or one or more microcontrollers that execute program instructions (e.g., software), among other computing devices. In some embodiments, the program instructions are communicated to the controller in the form of various individual settings (or program files), defining operational parameters for carrying out a process on a substrate/wafer within the plasma processing systems 100 and 700. In some embodiments, the operational parameters are included in a recipe defined by process engineers to accomplish one or more processing steps during the fabrication of one or more layers, materials, metals, oxides, silicon, silicon dioxide, surfaces, circuits, and/or dies on the substrate/wafer.

In some embodiments, the controller is a part of, or connected to, a computer that is integrated with, or connected to, the plasma processing systems 100 and 700, or that is otherwise networked to the plasma processing systems 100 and 700, or a combination thereof. For example, in some embodiments, the controller is implemented in a "cloud" or all or a part of a fab host computer system, which allows for remote access for control of substrate/wafer processing by the plasma processing systems 100 and 700.

The controller enables remote access to the plasma processing systems 100 and 700 to provide for monitoring of current progress of fabrication operations, provided for examination of a history of past fabrication operations, provide for examination of trends or performance metrics from a plurality of fabrication operations, provide for changing of processing parameters, provide for setting of subsequent processing steps, and/or provide for initiation of a new substrate/wafer fabrication process.

In some embodiments, a remote computer, such as a server computer system, provides process recipes to the controller of the plasma processing systems 100 and 700 over a computer network, which includes a local network and/or the Internet. The remote computer includes a user interface that enables entry or programming of parameters and/or settings, which are then communicated to the controller of the plasma processing systems 100 and 700 from the remote computer. In some examples, the controller receives instructions in the form of settings for processing a substrate/wafer within the plasma processing systems 100 and 700. It should be understood that the settings are specific to a type of process to be performed on a substrate/wafer and a type of tool/device/component that the controller interfaces with or controls. In some embodiments, the controller is distributed, such as by including one or more discrete controllers that are networked together and synchronized to work toward a common purpose, such as operating the plasma processing systems 100 and 700 to perform a prescribed process on a substrate/wafer. An example of a distributed controller for such purposes includes one or more integrated circuits on a chamber in communication with one or more integrated circuits located remotely (such as at a platform level or as part of a remote computer) that combine to control a process in a chamber. Depending on a process operation to be performed by the plasma processing systems 100 and 700, the controller communicates with one or more of other tool circuits or modules, other tool components, cluster tools, other tool interfaces, adjacent tools, neighboring tools, tools located throughout a factory, a main computer, another controller, or tools used in material transport that bring containers of substrates/wafers to and from tool locations and/or load ports in a semiconductor manufacturing factory.

It should be understood that, in some embodiments, operation of the plasma processing systems 100 and 700 includes performance of various computer-implemented operations involving data stored in computer systems. These computer-implemented operations are those that manipulate physical quantities. In various embodiments, the computer-implemented operations are performed by either a general purpose computer or a special purpose computer. In some embodiments, the computer-implemented operations are performed by a selectively activated computer, and/or are directed by one or more computer programs stored in a computer memory or obtained over a computer network. When computer programs and/or digital data is obtained over the computer network, the digital data may be processed by other computers on the computer network, e.g., a cloud of computing resources. The computer programs and digital data are stored as computer-readable code on a non-transitory computer-readable medium. The non-transitory computer-readable medium is any data storage hardware unit, e.g., a memory device, etc., that stores data, which is thereafter readable by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), digital video/versatile disc (DVD), magnetic tapes, and other optical and non-optical data storage hardware units. In some embodiments, the computer programs and/or digital data are distributed among multiple computer-readable media located in different computer systems within a network of coupled computer systems, such that the computer programs and/or digital data is executed and/or stored in a distributed fashion.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

What is claimed is:

1. A plasma processing system, comprising:
   a plasma processing chamber;
   a coil disposed next to the plasma processing chamber, the coil having a first end and a second end;
   a first direct-drive radiofrequency power supply having an output through which a first shaped-amplified square waveform signal is transmitted;
   a first reactive circuit connected between the output of the first direct-drive radiofrequency power supply and the first end of the coil, the first reactive circuit configured to transform the first shaped-amplified square waveform signal into a first shaped-sinusoidal signal in route to the first end of the coil;
   a second direct-drive radiofrequency power supply having an output through which a second shaped-amplified square waveform signal is transmitted; and
   a second reactive circuit connected between the output of the second direct-drive radiofrequency power supply and the second end of the coil, the second reactive circuit configured to transform the second shaped-amplified square waveform signal into a second shaped-sinusoidal signal in route to the second end of the coil.

2. The plasma processing system as recited in claim 1, wherein the first direct-drive radiofrequency power supply and the second direct-drive radiofrequency power supply have matching configurations, and wherein the first reactive circuit and the second reactive circuit have matching configurations.

3. The plasma processing system as recited in claim 2, wherein the first direct-drive radiofrequency power supply includes an electrical signal generator connected to transmit a first electrical signal through a first gate driver to a first end of a primary winding of a pulse transformer, the electrical signal generator also connected to transmit a second electrical signal through a second gate driver to a second end of the primary winding of the pulse transformer, the first direct-drive radiofrequency power supply including a half-bridge transistor circuit that includes a first transistor and a second transistor connected in series between a voltage supply and a reference ground potential, the first transistor having a gate connected to a first secondary winding of the pulse transformer, the second transistor having a gate connected to a second secondary winding of the pulse transformer, the output of the first direct-drive radiofrequency power supply provided at a connection between the first transistor and the second transistor.

4. The plasma processing system as recited in claim 2, wherein the first reactive circuit includes a variable capacitor.

5. A method for operating a plasma processing system, comprising:
operating a first direct-drive radiofrequency signal generator to generate a first shaped-amplified square waveform signal;
transmitting the first shaped-amplified square waveform signal to a first reactive circuit;
operating the first reactive circuit to transform the first shaped-amplified square waveform signal into a first shaped-sinusoidal signal;
transmitting the first shaped-sinusoidal signal to a first end of a coil of a plasma processing chamber, the first shaped-sinusoidal signal conveying radiofrequency power to the coil;
operating a second direct-drive radiofrequency signal generator to generate a second shaped-amplified square waveform signal;
transmitting the second shaped-amplified square waveform signal to a second reactive circuit;
operating the second reactive circuit to transform the second shaped-amplified square waveform signal into a second shaped-sinusoidal signal; and
transmitting the second shaped-sinusoidal signal to a second end of the coil of the plasma processing chamber, the second shaped-sinusoidal signal conveying radiofrequency power to the coil.

6. The method as recited in claim 5, wherein the first shaped-sinusoidal signal conveys about one-half of a total amount of radiofrequency power to the coil, and the second shaped-sinusoidal signal conveys about one-half of the total amount of radiofrequency power to the coil.

7. The method as recited in claim 5, wherein the first direct-drive radiofrequency signal generator and the second direct-drive radiofrequency signal generator have matching configurations, and wherein the first reactive circuit and the second reactive circuit have matching configurations.

8. The method as recited in claim 5, wherein the first direct-drive radiofrequency signal generator and the second direct-drive radiofrequency signal generator are operated at a same direct current rail voltage.

9. The method as recited in claim 8, wherein the same direct current rail voltage is less than a voltage across the coil.

10. The method as recited in claim 5, further comprising:
adjusting a capacitance setting within the first reactive circuit so that a peak amount of radiofrequency power is transmitted from the first direct-drive radiofrequency power supply through the first reactive circuit to the first end of the coil; and
adjusting a capacitance setting within the second reactive circuit so that a peak amount of radiofrequency power is transmitted from the second direct-drive radiofrequency power supply through the second reactive circuit to the second end of the coil.

11. A plasma processing system, comprising:
a plasma processing chamber;
a coil disposed next to the plasma processing chamber, the coil having a first end and a second end;
a direct-drive radiofrequency power supply having an output through which a shaped-amplified square waveform signal is transmitted;
a reactive circuit connected between the output of the direct-drive radiofrequency power supply and the first end of the coil, the reactive circuit configured to transform the shaped-amplified square waveform signal into a shaped-sinusoidal signal in route to the first end of the coil; and
a variable capacitor having an input terminal connected to the second end of the coil, the variable capacitor having an output terminal connected to a reference ground potential.

12. The plasma processing system as recited in claim 11, wherein the second end of the coil is connected to one electrical component capable of affecting radiofrequency power transmission from the coil to a plasma within the plasma processing chamber, the one electrical component being the variable capacitor.

13. The plasma processing system as recited in claim 11, wherein the direct-drive radiofrequency power supply includes an electrical signal generator connected to transmit a first electrical signal through a first gate driver to a first end of a primary winding of a pulse transformer, the electrical signal generator also connected to transmit a second electrical signal through a second gate driver to a second end of the primary winding of the pulse transformer, the direct-drive radiofrequency power supply including a half-bridge transistor circuit that includes a first transistor and a second transistor connected in series between a voltage supply and another reference ground potential, the first transistor having a gate connected to a first secondary winding of the pulse transformer, the second transistor having a gate connected to a second secondary winding of the pulse transformer, the output of the direct-drive radiofrequency power supply provided at a connection between the first transistor and the second transistor.

14. A method for operating a plasma processing system, comprising:
operating a direct-drive radiofrequency signal generator to generate a shaped-amplified square waveform signal;
transmitting the shaped-amplified square waveform signal to a reactive circuit;
operating the reactive circuit to transform the shaped-amplified square waveform signal into a shaped-sinusoidal signal;
transmitting the shaped-sinusoidal signal to a first end of a coil of a plasma processing chamber, the shaped-sinusoidal signal conveying radiofrequency power to the coil; and
adjusting a capacitance setting of a variable capacitor connected between a second end of the coil and a reference ground potential to achieve a prescribed condition associated with conveyance of radiofrequency power from the coil to a plasma within the plasma processing chamber.

15. The method as recited in claim 14, wherein the prescribed condition is a substantial balance of voltage across the coil.

16. The method as recited in claim 14, wherein the prescribed condition is a balanced radiofrequency power feeding condition in which a reactance of the variable capacitor is substantially equal to one-half of a reactance of the coil.

17. The method as recited in claim 14, wherein the prescribed condition is optimization of a plasma density within the plasma processing chamber.

18. The method as recited in claim 14, wherein the prescribed condition is optimization of a plasma potential within the plasma processing chamber.

19. The method as recited in claim 14, wherein the prescribed condition is optimization of a voltage drop across a plasma sheath within the plasma processing chamber.

20. The method as recited in claim 14, wherein the prescribed condition is optimization of an electron temperature within the plasma within the plasma processing chamber.

* * * * *